United States Patent
Fukatsu et al.

(10) Patent No.: US 7,547,181 B2
(45) Date of Patent: Jun. 16, 2009

(54) SUBSTRATE POSITION CORRECTING METHOD AND APPARATUS USING EITHER SUBSTRATE RADIUS OR CENTER OF ROTATION CORRECTION ADJUSTMENT SUM

(75) Inventors: Eiji Fukatsu, Kyoto (JP); Hiroyuki Yashiki, Kyoto (JP); Hideki Adachi, Kyoto (JP); Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 22 days.

(21) Appl. No.: 11/270,338

(22) Filed: Oct. 28, 2005

(65) Prior Publication Data
US 2006/0102289 A1    May 18, 2006

(30) Foreign Application Priority Data
Nov. 15, 2004  (JP)  ............................. 2004-330404
Nov. 15, 2004  (JP)  ............................. 2004-330405

(51) Int. Cl.
*H01L 21/68* (2006.01)
*H01L 21/677* (2006.01)
*G05B 19/18* (2006.01)

(52) U.S. Cl. ........................ 414/757; 414/936; 414/609; 700/59

(58) Field of Classification Search ................ 414/757, 414/936, 783, 433, 781, 766, 779, 780; 73/9, 73/1.38, 460; 134/33; 318/640; 74/84 R; 250/491.1; 29/759; 198/345.1
See application file for complete search history.

(56) References Cited

U.S. PATENT DOCUMENTS 4,655,584 A * 4/1987 Tanaka et al. .................. 355/53

(Continued)

FOREIGN PATENT DOCUMENTS

JP            60-239024          11/1985

(Continued)

OTHER PUBLICATIONS

Japanese Office Action issued Sep. 2, 2008 in corresponding Japanese Patent Application 2004-330404.

(Continued)

*Primary Examiner*—Gregory W Adams
(74) *Attorney, Agent, or Firm*—Ostrolenk, Faber, Gerb & Soffen, LLP

(57) ABSTRACT

A substrate W rotates about the center of rotations A0 of a spin base 3, while supported by plural support pins 5 in such a manner that the substrate W can freely slide and while held owing to the force of friction which develops between the bottom surface of the substrate W and the support pins 5. After a detection sensor 74 detects, while the substrate W rotates, an edge surface position (eccentric position) of the edge surface of the substrate which is the farthest from the center of rotations A0, a press block 71 pushes this edge surface position to a preset position P1 which is away along the horizontal direction from the center of rotations A0 by a distance which is determined in accordance with the radius of the substrate W. This aligns the eccentric position to the preset position P1 and positions the center W0 of the substrate within a predetermined range from the center of rotations A0.

16 Claims, 17 Drawing Sheets

U.S. PATENT DOCUMENTS

| | | | |
|---|---|---|---|
| 4,685,206 A | | 8/1987 | Kobayashi et al. |
| 5,492,566 A | | 2/1996 | Sumnitsch |
| 5,509,771 A | * | 4/1996 | Hiroki .................. 414/217 |
| 5,851,102 A | * | 12/1998 | Okawa et al. .............. 414/783 |
| 6,056,825 A | | 5/2000 | Sumnitsch |
| 6,104,002 A | * | 8/2000 | Hirose et al. .............. 219/390 |
| 6,152,677 A | * | 11/2000 | Tateyama et al. ........... 414/738 |
| 6,316,367 B1 | | 11/2001 | Sumnitsch |
| 6,811,618 B2 | | 11/2004 | Kuroda |
| 6,824,613 B2 | * | 11/2004 | Dai et al. ................. 118/72 |
| 2003/0031549 A1 | * | 2/2003 | Berger et al. .............. 414/757 |
| 2003/0098048 A1 | | 5/2003 | Kuroda |
| 2003/0161706 A1 | * | 8/2003 | Kurita et al. .............. 414/217 |
| 2003/0196686 A1 | * | 10/2003 | Chiu et al. .................. 134/33 |

FOREIGN PATENT DOCUMENTS

| | | |
|---|---|---|
| JP | 61-134814 | 6/1986 |
| JP | 62-95844 | 5/1987 |
| JP | 5-13037 | 2/1993 |
| JP | 5-226459 | 9/1993 |
| JP | 6-13450 | 1/1994 |
| JP | 6-316777 | 11/1994 |
| JP | 7-7069 | 1/1995 |
| JP | 8-17897 | 1/1996 |
| JP | 8-335624 | 12/1996 |
| JP | 10-89904 | 4/1998 |
| JP | 11-87468 | 3/1999 |
| JP | 11-176795 | 7/1999 |
| JP | 2000-235948 | 8/2000 |
| JP | 2000-286325 | 10/2000 |
| JP | 2002-246444 | 8/2002 |
| JP | 2003-203891 A | 7/2003 |
| JP | 2003-229399 | 8/2003 |

OTHER PUBLICATIONS

Office Action issued Dec. 24, 2008 in corresponding Japanese Patent Application No. 2004-330405.

* cited by examiner

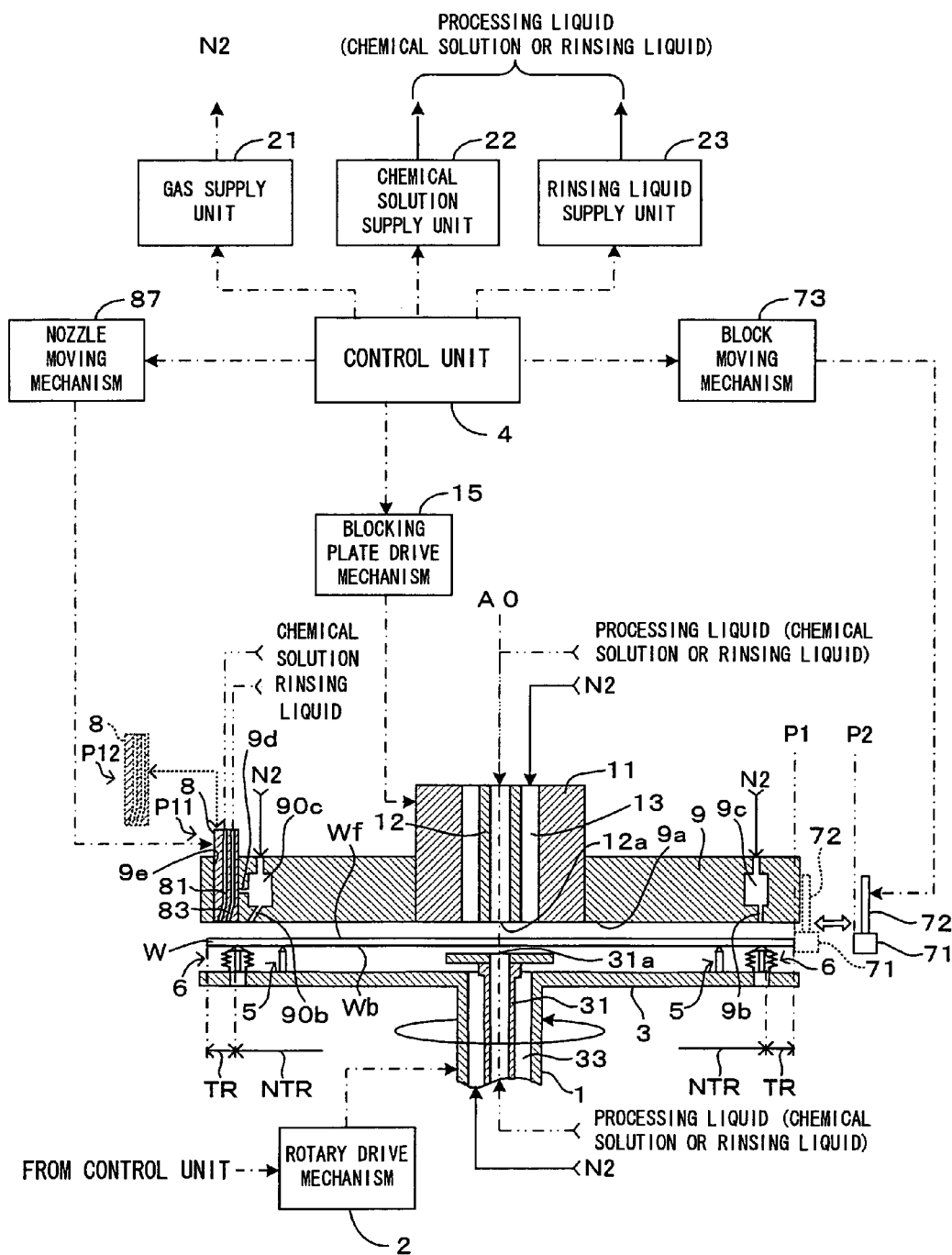

F I G. 1 5
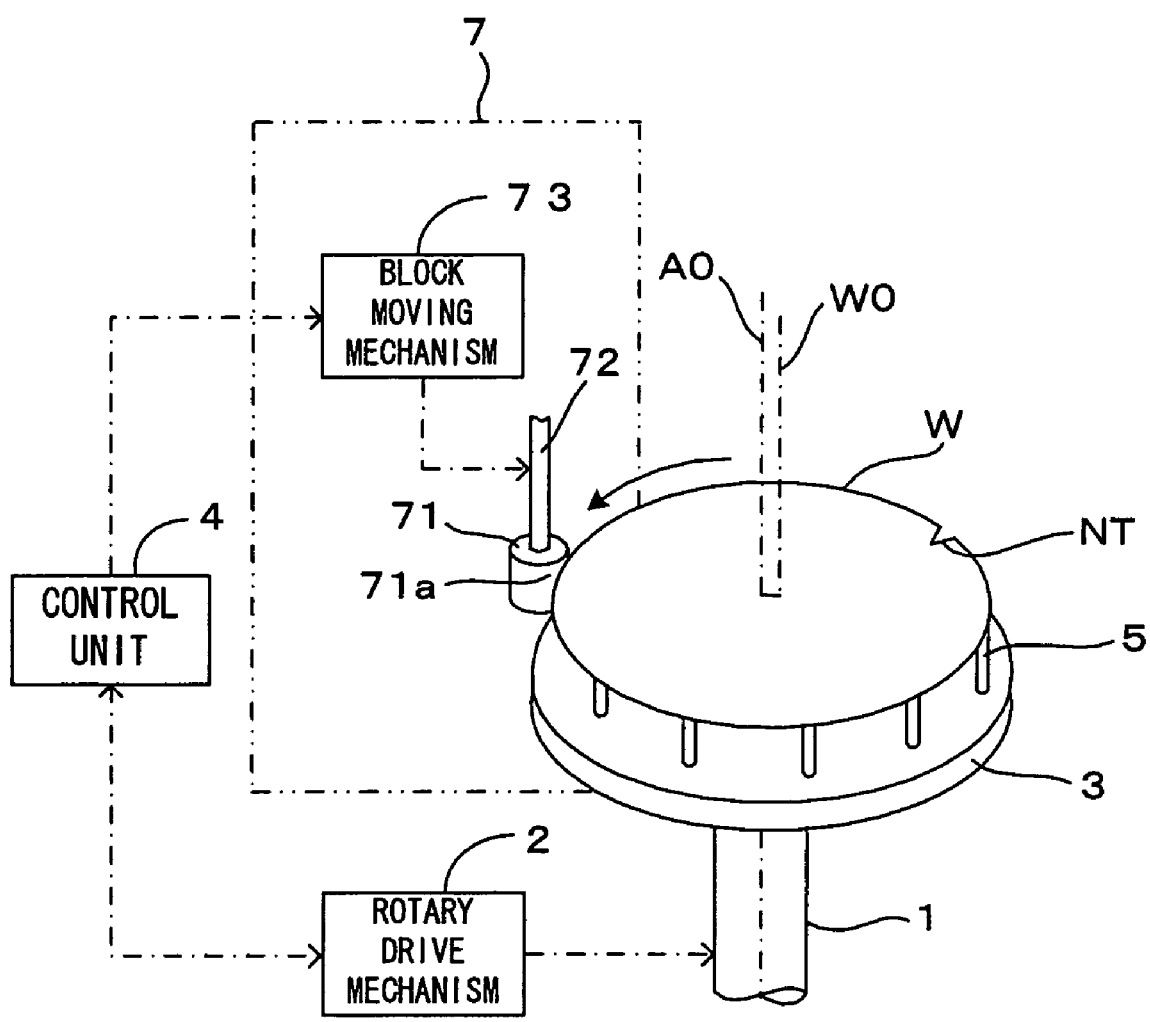

SUBSTRATE POSITION CORRECTING METHOD AND APPARATUS USING EITHER SUBSTRATE RADIUS OR CENTER OF ROTATION CORRECTION ADJUSTMENT SUM

CROSS REFERENCE TO RELATED APPLICATION

The disclosure of Japanese Patent Applications enumerated below including specification, drawings and claims is incorporated herein by reference in its entirety:
No. 2004-330404 filed Nov. 15, 2004; and
No. 2004-330405 filed Nov. 15, 2004.

BACKGROUND OF THE INVENTION

1. Field of the Invention

The present invention relates to a substrate processing apparatus and a substrate processing method with which it is possible to perform predetermined processing such as cleaning upon semiconductor wafers, glass substrates for photo masks, glass substrates for liquid crystal displays, glass substrates for optical disk substrates and the like, and to a substrate position correcting apparatus for and a substrate position correcting method of correcting the positions of such substrates.

2. Description of the Related Art

While plural film forming steps to form thin films such as a photo resist on the front surface of a substrate such as a semiconductor wafer are among a series of steps to process the substrate, the film forming steps may result in formation of films also on the back surface of the substrate or in a rim portion of the front surface of the substrate. However, it is in general only an area where a device is to be formed at the center of the front surface of the substrate that demands film formation, and if film formation occurs on the back surface of the substrate or in the rim portion of the front surface of the substrate, the thin films formed on the back surface of the substrate or in the rim portion of the front surface of the substrate could fall off when contacting other apparatus at a step following the film formation steps, which could decrease the yield or lead to a trouble in a substrate processing apparatus itself.

Noting this, for removal of thin films formed on the back surface of a substrate and in a rim portion of the front surface of the substrate, the apparatus according to Japanese Patent Application Unexamined Publication No. 2000-235948 (Patent Literature 1) has been proposed for instance. In this apparatus, holding members such as chuck pins disposed in the vicinity of a rim portion of a base member hold a substrate whose surfaces bear thin films and the base member then rotates, thereby rotating the substrate. Further, a chemical solution is supplied to the back surface of the rotating substrate. At this stage, a rotating member whose opposed surface is opposed against the front surface of the substrate and which is spaced away by a predetermined distance from the front surface of the substrate rotates, the rotations of the substrate and the rotating member spread the chemical solution all over the back surface of the substrate, and the chemical solution etches away unwanted substances on the back surface of the substrate. The chemical solution also flows over to the rim portion of the front surface of the substrate via the edge surface of the substrate, and etches away unwanted substances which are in the rim portion of the front surface, too. In this manner, the thin films are etched away only on the back surface of the substrate and in the rim portion of the front surface of the substrate.

By the way, the substrate processing above is executed for removal of the thin films existing within a certain range which is from around a non-processing area approximately at the center of the front surface of the substrate, and it is desirable to accurately control this removal range, namely, the width that a film is removed from the substrate by the etching from the edge surface to inside (hereinafter referred to as the "rim etching width". In the event that a metal layer of copper or the like is formed as a thin film on the front surface of the substrate in particular, it is extremely important to ensure a uniform rim etching width all along the circumference during the substrate processing above which aims at removal of metal in the vicinity of the edge surface (bevel).

It is therefore necessary to precisely align the physical center of the substrate (hereinafter referred to simply as "the center of the substrate") with the center of rotations of the base member, such as a spin base, which rotates the substrate during the substrate processing above. The reason is because eccentricity (deviation) between the center of the substrate and the center of rotations of the base member results in variations of the amount of the chemical solution supplied to the rim portion of the front surface of the substrate and makes it impossible to ensure a uniform rim etching width all along the circumference of the substrate. This is similar also for such processing which requires supplying the chemical solution to the rim portion of the front surface of the substrate from a nozzle which is disposed facing the rim portion of the front surface of the rotating substrate for removal of a thin film formed in the rim portion of the front surface of the substrate. In this case, eccentricity between the center of the substrate and the center of rotations of the base member changes the distance between the edge surface of the substrate and the nozzle during rotations of the substrate, whereby the rim etching width becomes different along the circumferential direction. As a result, it is not possible to ensure a uniform rim etching width all along the circumference of the substrate.

Further, in the substrate processing apparatus for processing a substrate such as a semiconductor wafer described above, a transporter such as a transportation robot transports a substrate to be processed and hands the substrate over to a substrate rotator unit such as a spin chuck. However, eccentricity between the center of the substrate and the center of rotations of the substrate rotator unit invites inconvenience to the processing process as described above. Noting this, it is critical to reduce such eccentricity as much as possible.

Centering is therefore performed which aligns the center of the substrate to the center of rotations of the substrate rotator unit. In the apparatus described in Japanese Patent Application Unexamined Publication No. H7-7069 (Patent Literature 2) for example, a centering mechanism aligns the center of the substrate to the center of rotations of a suction stage (substrate rotator unit). More specifically, the centering mechanism closes, thereby holding a substrate at the outer rim of the substrate, and aligns the center of the substrate to the center of rotations of the substrate rotator unit. As the suction stage performs a sucking action, the substrate is fixed to a surface of the stage, which prevents deviation of the substrate.

SUMMARY OF THE INVENTION

In the apparatus described in Patent Literature 2 however, the centering mechanism requires a complex and large structure in order to hold a substrate at the outer rim of the substrate. To secure a relatively big space inside the substrate processing apparatus for installation of the centering mechanism, the apparatus as a whole must be big, which is against the demand to a smaller space and a lower cost. Installation of the centering mechanism within a processing part such as a processing chamber which processes a substrate in particular is met with a major restriction regarding the space for installation. In addition, since it is necessary to treat the centering mechanism such that the centering mechanism will be resistant against a chemical solution, a further cost increase is inevitable.

Meanwhile, in the apparatus described in Patent Literature 1, three or more holding members disposed in the vicinity of a rim portion of the base member abut on the edge surface of a substrate and hold the substrate at the substrate outer rim at three or more positions. Hence, as the three or more holding members each abut on the edge surface of the substrate, the center of the substrate is positioned within a predetermined range from the center of rotations of the base member.

However, the method of holding a substrate with the holding members which abut on the edge surface of the substrate may lead to the following inconvenience. That is, during etching of unwanted substances which are in a rim portion of the front surface of a rotating substrate by means of a chemical solution supplied to the back surface of the substrate and flowing over to the rim portion of the substrate's front surface via the edge surface of the substrate, as the holding members abut on the edge surface of the substrate and hold the substrate, the amount in which the chemical solution is supplied becomes different between the section in the rim portion of the substrate's front surface grasped by the holding members and the other section, and therefore, it is not possible to uniformly etch the rim portion of the front surface of the substrate. In the meantime, during etching which supplies the chemical solution toward the rim portion of the front surface of the substrate from a nozzle which is disposed facing the rim portion of the front surface of the rotating substrate, the chemical solution supplied to the rim portion of the substrate's front surface flows outward along the diameter direction of the substrate, and a part of the chemical solution may hit and jump at the holding members and corrode a central section in the front surface of the substrate (non-processing area).

Further, in the case of the method which makes the holding members abut on the edge surface of the substrate and hold the substrate, since the holding members rotate about the center of rotations of the base member while holding the substrate at the edge surface of the substrate, the holding members disturb air flows around the edge surface of the substrate. As a result, the mist-like chemical solution splashed during the processing may get blown up into a space created between the substrate and the rotating member and intrude and adhere to the central section in the front surface of the substrate.

A first object of the present invention is to provide a substrate processing apparatus and a substrate processing method with which it is possible to process, during predetermined processing in which a substrate rotates while held, the substrate while maintaining the substrate accurately positioned and preventing the holding of the substrate from adversely influencing the substrate.

A second object of the present invention is to provide a substrate position correcting apparatus and a substrate position correcting method which realizes accurate positioning by means of a simple structure.

The invention is directed to a substrate processing apparatus for and a substrate processing method of performing predetermined processing while holding and rotating a substrate, and to achieve the first object above, uses the following structures. The substrate processing apparatus according to the invention comprises: a substrate rotating mechanism which rotates the substrate about a predetermined center of rotations while supporting in such a manner that the substrate can freely slide along the horizontal direction, and holding the substrate by means of the force of friction developing at the substrate; and a position correcting mechanism which exerts along the horizontal direction greater force than the force of friction upon the substrate on the substrate rotating mechanism, makes the substrate slide toward the center of rotations of the substrate rotating mechanism, and accordingly corrects the position of the substrate along the horizontal direction. The substrate processing method according to the invention comprises the steps of: rotating the substrate about a predetermined center of rotations while supporting in such a manner that the substrate can freely slide on a substrate rotating mechanism along the horizontal direction, and holding the substrate by means of the force of friction developing between the substrate rotating mechanism and the substrate; and exerting greater force than the force of friction upon the substrate on the substrate rotating mechanism, sliding the substrate toward the center of rotations of the substrate rotating mechanism, and accordingly correcting the position of the substrate along the horizontal direction.

In one aspect of the invention, the substrate position correcting apparatus and the substrate position correcting method according to the invention have the following structures, to achieve the second object above. A substrate rotates about the center of rotations of a rotating member, while supported for free sliding by supports and held due to the force of friction developing between the bottom surface of the substrate and the supports. After detection of an edge surface position of the edge surface of the substrate which is the farthest from the center of rotations of the rotating member while the substrate remains rotating, a pressing member pushes the substrate toward the center of rotations of the rotating member until this edge surface position matches with a preset position which is away along the horizontal direction from the center of rotations of the rotating member by a distance which is determined in accordance with the radius of the substrate.

In other aspect of the invention, the substrate position correcting apparatus and the substrate position correcting method according to the invention have the following structures, to achieve the second object above. The substrate rotates about the center of rotations of the rotating member, while supported for free sliding by supports and held due to the force of friction developing between the bottom surface of the substrate and the supports. The pressing member is so arranged that an abutting section, in which the pressing member abuts on the edge surface the substrate, to the preset position which is away along the horizontal direction from the center of rotations of the rotating member by a distance which is determined in accordance with the radius of the substrate, whereby an edge surface position of the edge surface of the rotating substrate which is outward along the diameter direction than the preset position is pushed while abutting on the pressing member.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 1 is a drawing which shows an embodiment of a substrate processing apparatus according to the invention;

FIG. 15 is a drawing which shows a second embodiment of the substrate position correcting apparatus according to the invention;

DETAILED DESCRIPTION OF THE PREFERRED EMBODIMENTS

<Substrate Processing Apparatus>

Figure 2:
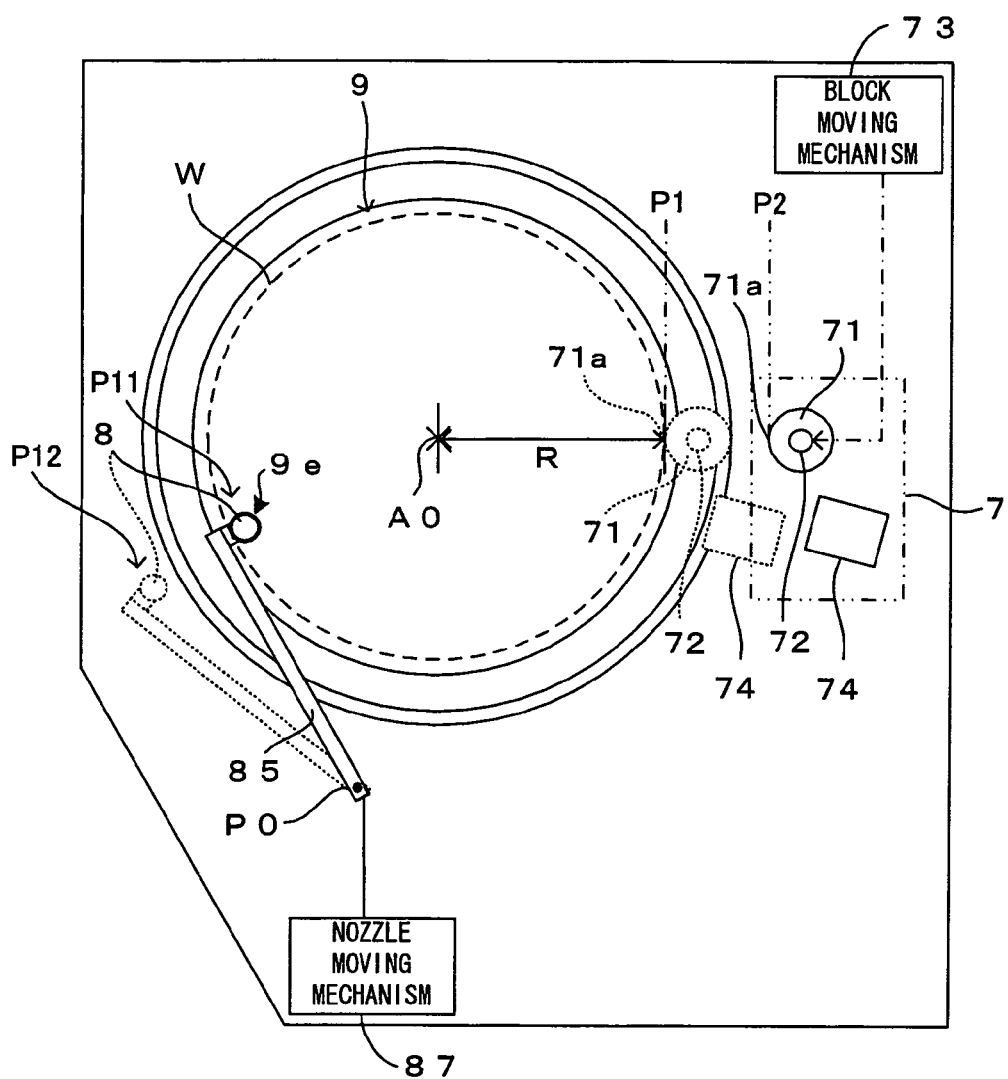
FIG. 2 is a plan view of the substrate processing apparatus which is shown in FIG. 1.

FIG. 1 is a drawing which shows an embodiment of a substrate processing apparatus according to the invention. FIG. 2 is a plan view of the substrate processing apparatus which is shown in FIG. 1. This substrate processing apparatus is capable of performing at the same time (i.e., capable of executing one-step processing) bevel etching process, which removes by etching thin films such as a metal layer and a photo resist layer from a rim portion of a substrate's front surface Wf, and back surface cleaning process during which a substrate's back surface Wb is cleaned, and this apparatus has the following structure.

In this substrate processing apparatus, a hollow rotation shaft 1 is linked with the rotation shaft of a rotary drive mechanism 2 which comprises a motor, and as the rotary drive mechanism 2 is driven, the rotation shaft 1 rotates about a center of rotations A0. A spin base 3 is linked to and integrated with the top end of the rotation shaft 1 by a fastening part which may be a screw. Hence, when the rotary drive mechanism 2 is driven, the spin base 3 rotates about the center of rotations A0. In this embodiment, the rotary drive mechanism 2 thus corresponds to the "rotator unit" of the invention and the spin base 3 corresponds to the "rotating member" of the invention.

Incorporated within the rotary drive mechanism 2 is a rotation position (angle of rotation) detector, such as a rotary encoder, which detects a rotation position of the spin base 3 relative to a predetermined reference position and sends the rotation position to a control unit 4 which controls the apparatus as a whole. The control unit 4 is capable of driving the rotary drive mechanism 2 based on a signal sent from the rotation position detector and then positioning the spin base 3 at a desired rotation position.

As the "supports" of the invention, plural support pins 5 and plural support pins 6 are disposed to the top surface of the spin base 3 in a radial arrangement about the center of rotations A0 such that the support pins 5 and 6 project toward above. Each one of the plural support pins 5 and 6, when abutting on the substrate's back surface Wb (bottom surface), is capable of supporting the substrate W in such a manner that the substrate W is spaced apart from the spin base 3 by a predetermined distance, and that the substrate W can freely slide along the horizontal direction. This prevents damaging, contamination and the like of the bottom surface of the substrate W which will otherwise arise when the substrate W abuts on and is accordingly supported at the spin base 3. In the meantime, while supported by the support pins 5 and 6 for free sliding, the substrate W can nevertheless rotate, as it is held by the support pins 5 and 6, together with the spin base 3 about the center of rotations A0 because of the force of friction developing between the bottom surface of the substrate W and the support pins 5 and 6. In this embodiment, the rotary drive mechanism 2, the spin base 3 and the support pins 5 and 6 thus form the "substrate rotating mechanism".

Of these, the plural support pins 5 located on the spin base 3 on the inward side toward the center of rotations A0 as shown in the drawing form the "first support pin group" of the invention which alone can support the substrate. On the other side, the plural support pins 6 located on the outward side form the "second support pin group" of the invention. When an elevating driver which will be described later operates, each pin belonging to the second support pin group moves up or down, and the second support pin group alone or in combination with the first support pin group can support the substrate W. In this fashion, at least the plural support pins 5 or the plural support pins 6 support the substrate W approximately horizontally such that the front surface Wf of the substrate W is directed toward above. The number of the support pins 5 in the first support pin group, the number of the support pins 6 in the second support pin group and the pin arrangement in each group may be determined freely to the extent that it is possible to support the substrate W horizontally over a clearance which can allow insertion of a hand of a transporter or the like.

The coefficient of friction of the support pins 6 against the bottom surface of the substrate W are set larger than that of the support pins 5. Hence, as the mode of supporting the substrate is switched among (i) the mode that the first support pin group, consisting of the plural support pins 5, alone supports the substrate W at the bottom surface of the substrate W, (ii) the mode that the second support pin group, consisting of the plural support pins 6, alone supports the substrate W at the bottom surface of the substrate W and (iii) the mode that the first support pin group and the second support pin group both support the substrate W at the bottom surface of the substrate W, the force of friction developing at the bottom surface of the substrate W changes. In short, the force of friction developing at the bottom surface of the substrate W is reduced when the first support pin group, which has a relatively small coefficient of friction against the bottom surface of the substrate W, alone supports the substrate W, which makes it easy to horizontally slide the substrate W with application of external force upon the substrate W along the horizontal direction. On the other hand, when the second support pin group, which has a relatively large coefficient of friction against the bottom surface of the substrate W, alone supports the substrate W or both the first support pin group and the second support pin group support the substrate W, the force of friction developing at the bottom surface of the substrate W increases, thereby suppressing horizontal sliding of the substrate W and stably holding the substrate W.

Figure 3A:
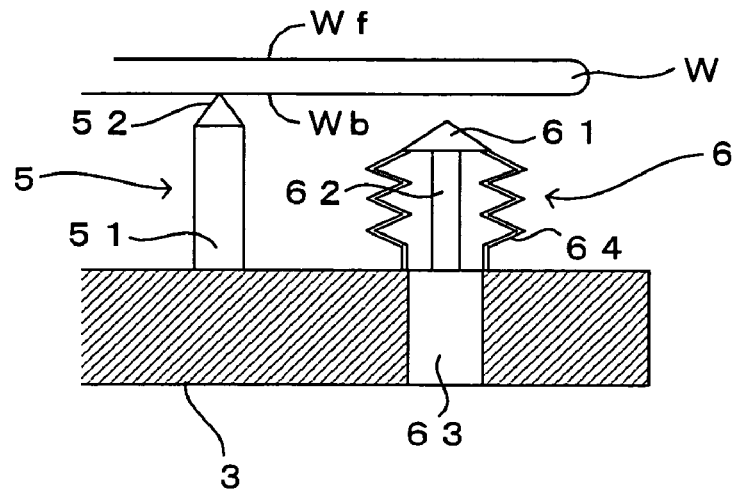
FIGS. 3A and 3B are partially enlarged views which show structures of support pins.
Figure 3B:
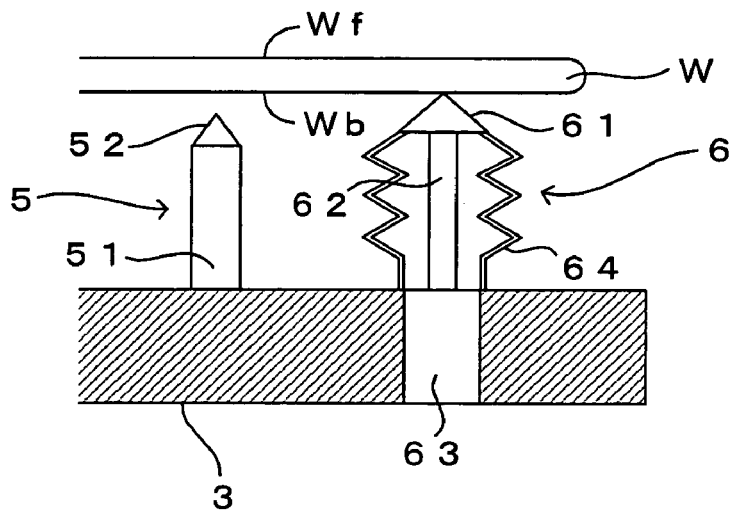

FIGS. 3A and 3B are partially enlarged views which show structures of the support pins 5 and 6. The plural support pins 5 and the plural support pins 6 all have the identical structures, and therefore, the structure of one support pin 5 and that of one support pin 6 will now be described with reference to the associated drawings. The support pin 5 comprises a pin main body 51 fixed upright on the top surface of the spin base 3 and an abutting part 52 above the pin main body 51 and capable of abutting on the bottom surface of the substrate W, which are combined and integrated with each other. Meanwhile, the support pin 6 comprises an abutting part 61 which is capable of abutting on and moving away from the bottom surface of the substrate W, a movable rod 62 which supports the abutting part 61 such that the abutting part 61 can move along the up/down direction, an elevating driver 63 (elevating drive unit) such as a motor which moves the movable rod 62 up and down, and a bellows 64 disposed surrounding the movable rod 62 and thereby blocking the movable rod 62 and the elevating driver 63 from an outside atmosphere. The top end of the bellows 64 is fixed to the bottom surface of the abutting part 61, and the bottom end of the bellows 64 is fixed to the top surface of the spin base 3. The elevating driver 63 is not limited to a motor, but may be any actuator such as an air cylinder.

The abutting part 61 of the support pin 6 is made of a material whose coefficient of friction against the bottom surface of the substrate W is large. The material of the abutting part 52 of the support pin 5 on the other hand is preferably a material whose coefficient of friction against the bottom surface of the substrate W is small and which will not damage the substrate W or create particles.

As the support pins 6 have the structure above, when the elevating drivers 63 drive the movable rods 62 to move up and down at strokes of a few mm via a driver link not shown in accordance with a drive signal from the control unit 4, the bellows 64 expand or shrink, thereby setting the height of the abutting parts 61 (i.e., the front tip position of the abutting parts 61) to the following positions relative to an abutting position where the support pins 5 abut on the bottom surface of the substrate W (i.e., the front tip position of the abutting parts 52). That is, as the movable rods 62 move down and the abutting parts 61 of the support pins 6 are set to a position which is lower than the abutting position at which the support pins 5 abut on the bottom surface of the substrate W as shown in FIG. 3A, the abutting parts 61 move away from the bottom surface of the substrate W, and as a result, the substrate W is supported by only the support pins 5. Meanwhile, as the movable rods 62 move up and the abutting parts 61 of the support pins 6 are set to a position which is higher than the abutting position at which the support pins 5 abut on the bottom surface of the substrate W as shown in FIG. 3B, the abutting parts 61 push up the substrate W and the abutting parts 52 move away from the bottom surface of the substrate W. At this stage, the bellows 64 expand as the abutting parts 61 move upward. In consequence, the substrate W is supported by only the support pins 6. Further, although not shown in the drawings, as the abutting parts 61 of the support pins 6 are set to a position which is the same as the abutting position of the support pins 5, the support pins 5 and the support pins 6 both support the substrate W.

A position correcting mechanism of the substrate processing apparatus will now be described. For precise control of a width (rim etching width) over which etching must occur from the edge surface of the substrate W toward inside, it is important to coincide the center of rotations A0 of the spin base 3 with the center W0 of the substrate. Noting the importance, in this embodiment, the center of rotations A0 of the spin base 3 is aligned to the center W0 of the substrate in the following manner. That is, in the event that the first support pin group alone consisting of the plural support pins 5 supports the substrate W as described above, the force of friction developing at the substrate W is smaller than where the second support pin group alone consisting of the plural support pins 6 supports the substrate W or both the first support pin group and the second support pin group support the substrate W, and it is therefore easy to horizontally slide the substrate W while preventing damaging of the substrate W, creation of particles and the like, by means of external force applied upon the substrate W along the horizontal direction.

Hence, where the first support pin group alone consisting of the plural support pins 5 supports the substrate W, greater force than the force of friction developing between the bottom surface of the substrate W and the support pins 5 may be applied upon the substrate W along the horizontal direction, to thereby correct the position of the substrate W along the horizontal direction without adversely affecting the substrate W. To this end, this embodiment uses a position correcting unit 7 (corresponding to the "position correcting mechanism" of the invention) which corrects the position of the substrate W so that the center of rotations A0 of the spin base 3 is aligned to the center W0 of the substrate.

<Substrate Position Correcting Apparatus According to First Embodiment>

Figure 4:
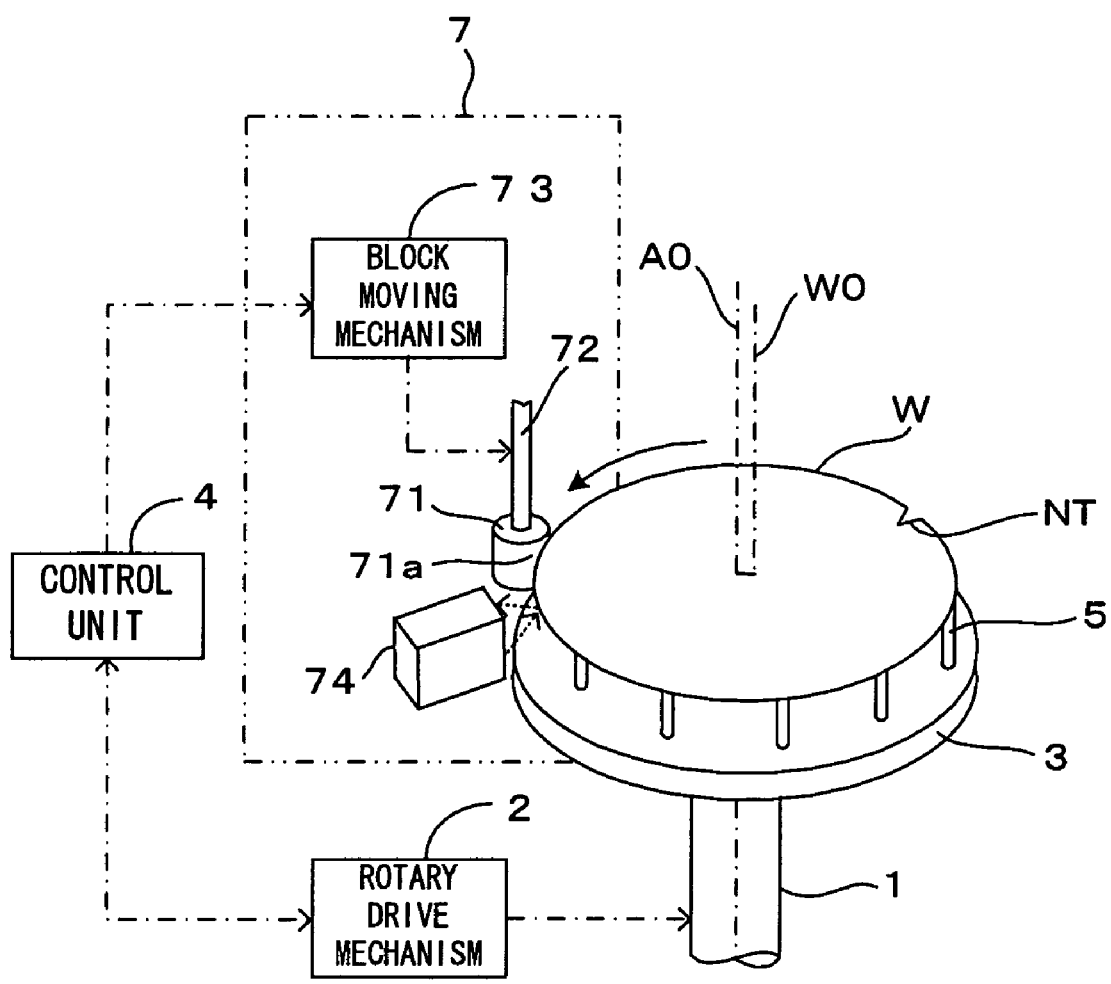
FIG. 4 is a drawing which shows a first embodiment of a substrate position correcting apparatus according to the invention.
Figure 5:
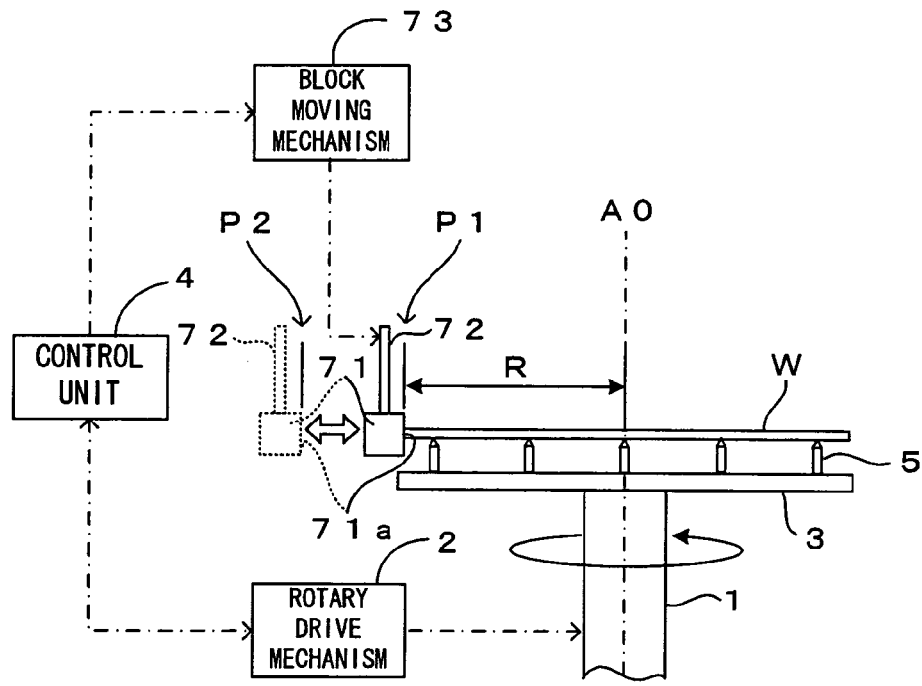
FIG. 5 is a side view of the substrate position correcting apparatus which is shown in FIG. 4.

FIG. 4 is a drawing which shows a structure of the position correcting mechanism. More precisely, FIG. 4 is a drawing which shows the first embodiment of the substrate position correcting apparatus according to the invention. FIG. 5 is a side view of the substrate position correcting apparatus of FIG. 4. This position correcting unit 7 comprises a press block 71 which abuts on the edge surface of the substrate W supported by the support pins 5 in such a manner that the substrate W can freely slide and which presses the substrate W along the horizontal direction, a rod 72 which supports the press block 71, a block moving mechanism 73 which is connected with the rod 72 and horizontally moves the press block 71 over a line which is on the center of rotations A0 of the spin base 3 (i.e., along the diameter direction of the spin base 3), and a detection sensor 74 which is disposed at the rim of the substrate W and detects the position of the edge surface of the substrate W.

The press block 71 is shaped like a cylinder, and fixedly seats on its top surface the rod 72. Hence, when the block moving mechanism 73 horizontally drives the rod 72, the substrate W is pushed and moves along the horizontal direction while a side surface 71a of the press block 71 (which corresponds to the "abutting section" of the invention) remains abutting on the edge surface of the substrate W. To be more specific, as the press block 71 (side surface 71a) abuts on and pushes the substrate W which is supported for free sliding by the support pins 5, owing to development of greater force than the force of friction developing between the substrate's back surface Wb (bottom surface) and the support pins 5, the substrate W slides on the support pins 5 and moves along the direction in which the substrate W is pushed. In this embodiment, the press block 71 thus functions as the "pressing member" of the invention.

Further, the rod 72 and the detection sensor 74 are linked with each other via a fixture such as a bracket not shown. Hence, as the block moving mechanism 73 operates in response to an operation command from the control unit 4, one drive system drives the press block 71 and the detection sensor 74 altogether.

The diameter of the circle which represents the cross section of the press block 71 is determined as described below, considering the influence exerted by a nick section which is formed in the rim portion of the substrate W. In short, the substrate W to be processed often has a nick section. For instance, the substrate W as a semiconductor wafer has a nick section which may be a notch, for the purpose of indicating the reference crystallographic orientation within a wafer surface. In this case, if the press block 71 becomes opposed against the nick section, the press block 71 gets stuck in the nick section and becomes incapable of properly pushing the substrate W. The structure of the press block 71 is therefore designed as described below, considering the existence of the nick section. An example that a notch NT is formed in the rim portion of the substrate W will now be described.

Figure 6:
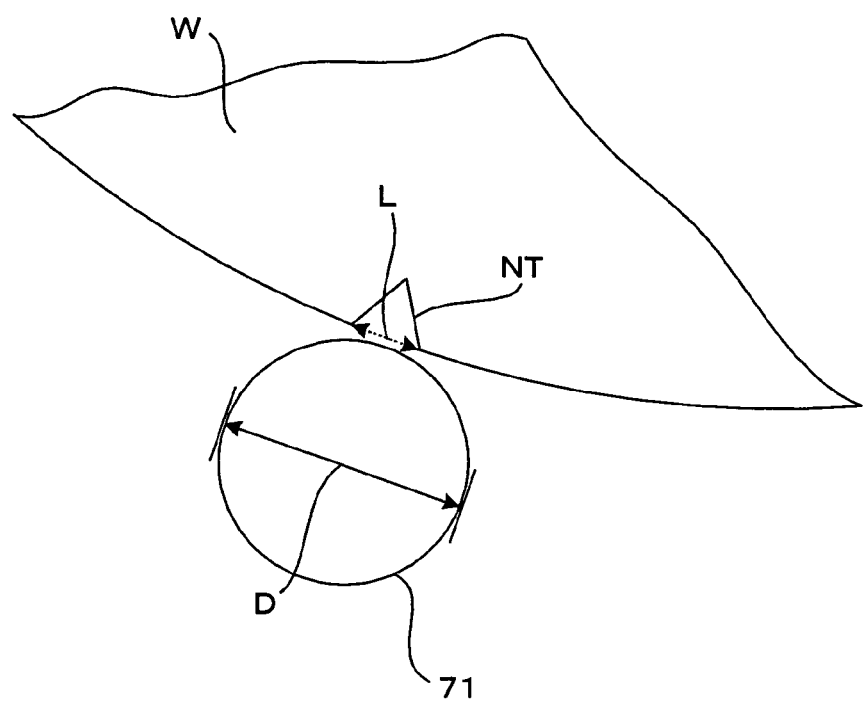
FIG. 6 is a drawing for describing a relationship between a notch of a substrate and the shape of a press block.

FIG. 6 is a drawing for describing a relationship between a notch of the substrate and the shape of the press block 71. The substrate W is shaped approximately as a disk, and its rim portion includes the notch NT. As shown in FIG. 6, the diameter D of the circle which represents the cross section of the press block 71 is determined to be sufficiently larger than the length L of an arc which is cut away from the circumference of the substrate W by the notch NT. This prevents the press block 71 from fitting into the notch NT even when the notch NT is at the position of the edge surface of the substrate W which is opposed against the press block 71, and therefore inhibits deviation of the substrate W.

Referring back to FIG. 2, the block moving mechanism 73 drives the rod 72 (and the detection sensor 74) as the "driver" of the invention, thereby positioning the abutting section 71a (the side surface of the press block 71) at a preset position P1 (denoted by the broken line in FIG. 2), which is apart from the center of rotations A0 of the spin base 3 along the horizontal direction by a distance R which is determined in accordance with the radius of the substrate W, and a separated position P2 (denoted by the solid line in FIG. 2) which is away sideways from the substrate W.

For correction of the position of the substrate W using the press block 71 driven by the block moving mechanism 73, an atmosphere blocking plate 9 which will be described later retracts to a position which is enough far toward above from the spin base 3 so that the atmosphere blocking plate 9 will not interfere with the press block 71. On the other hand, for predetermined processing such as cleaning of the substrate W with the atmosphere blocking plate 9 moved close to and opposed against the spin base 3, the press block 71 retracts to a position which is sufficiently far sideways from the spin base 3.

The block moving mechanism 73 positions the abutting section 71a of the press block 71 at the preset position P1 which is for example away from the center of rotations A0 of the spin base 3 along the horizontal direction by the distance R calculated by adding a positive tolerance value for a target positioning accuracy to the radius of the substrate W. Where the diameter of the substrate W is 300 mm and the target positioning accuracy is +0.05/−0.05 mm for instance, the abutting section 71a is moved to the preset position P1 which is away from the center of rotations A0 of the spin base 3 by 150.05 mm. Alternatively, the preset position P1 may be a position which is away from the center of rotations A0 along the horizontal direction by the radius of the substrate W.

The detection sensor 74 is disposed to the side of the substrate W, and detects the position of the edge surface of the substrate W which is supported on the rotating spin base 3 as the spin base 3 rotates and hence detects the distance from the detection sensor 74 to the edge surface of the substrate W. Since the distance between the detection sensor 74 and the center of rotations A0 of the spin base 3 is constant, eccentricity if any of the center W0 of the substrate relative to the center of rotations A0 of the spin base 3 changes the distance from the detection sensor 74 to the edge surface of the substrate W as the substrate rotates. Detection by the detection sensor 74 of the distance to the edge surface of the substrate W during rotations of the substrate W therefore identifies the farthest position of the edge surface (hereinafter referred to as the "eccentric position") from the center of rotations A0.

The detection sensor 74 comprises a light projector and a light receiver for example, and may be an optical distance sensor which measures a distance by triangulation based on the position of reflected light, a capacitance-type proximity sensor which measures a distance (or a change of the distance) through detection of the volume between the sensor and a target to measure, etc. In this embodiment, the detection sensor 74 thus functions as the "detector" of the invention.

The structure of the substrate processing apparatus will be continued while referring back to FIG. 1. This substrate processing apparatus comprises the atmosphere blocking plate 9 which is disposed opposed against the spin base 3 and blocks an atmosphere over the substrate's front surface Wf (top surface), and a gas supply unit 21 which supplies inert gas such as nitrogen gas into a space created between the atmosphere blocking plate 9 and the substrate's front surface Wf. As the gas supply unit 21 supplies nitrogen gas toward the substrate's front surface Wf and into the space created between the atmosphere blocking plate 9 and the substrate's front surface Wf, the substrate W is pushed against at least the plural support pins 5 or the plural support pins 6 and held at the spin base 3.

The atmosphere blocking plate 9 is attached to the bottom end of a hollow cylindrical support shaft 11 so that the atmosphere blocking plate 9 rotates with the support shaft 11 as they were one integrated part. A blocking plate drive mechanism 15 is linked with the support shaft 11. When a motor of the blocking plate drive mechanism 15 operates, the atmosphere blocking plate 9 rotates with the support shaft 11 about the center of rotations A0. Further, when an up-and-down actuator (which may be an air cylinder for instance) of the blocking plate drive mechanism 15 operates, the atmosphere blocking plate 9 moves closer to the spin base 3 or moves away upward from the spin base 3.

Figure 7:
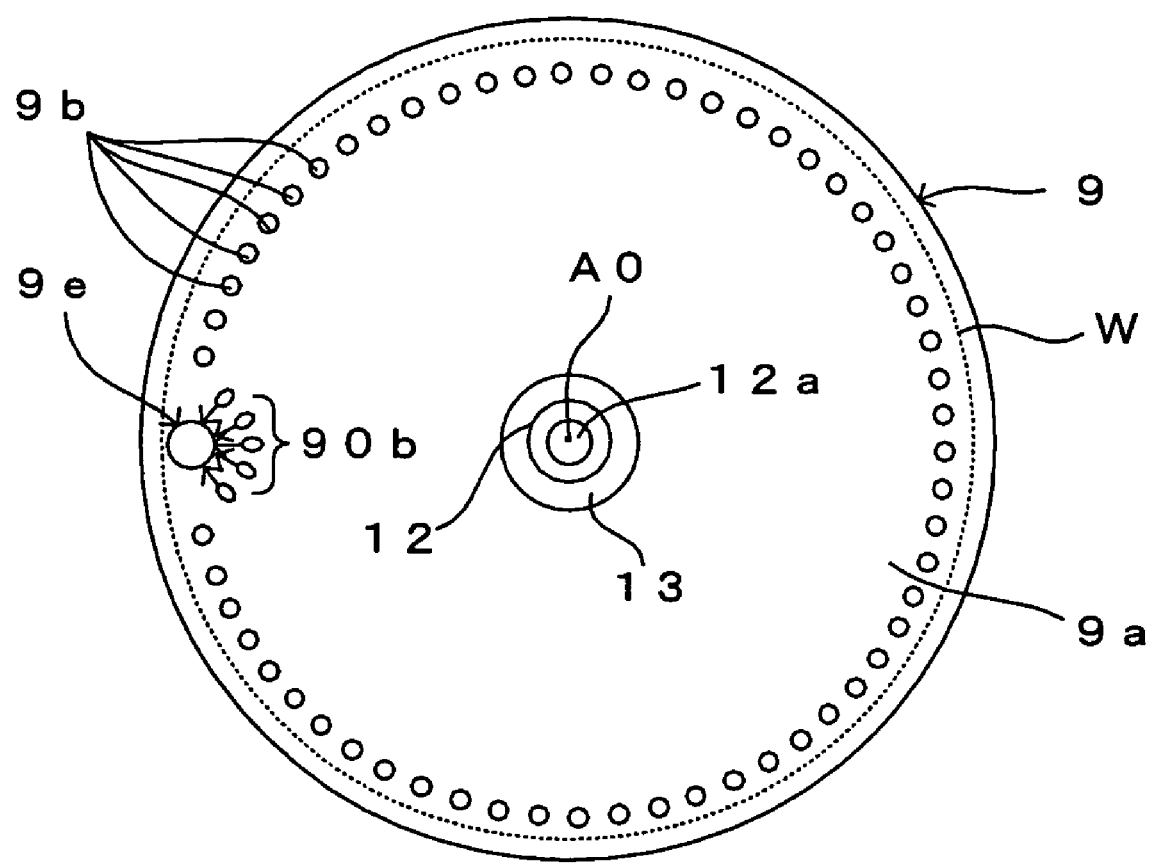
FIG. 7 is a bottom view of an atmosphere blocking plate.

FIG. 7 is a bottom view of the atmosphere blocking plate 9. The plan size of the circular surface of the atmosphere blocking plate 9 opposed against the substrate's front surface Wf is slightly larger than the plan size of the substrate W, and there is an opening at the center in the circular surface of the atmosphere blocking plate. In addition, there is one through hole 9e which penetrates the atmosphere blocking plate 9 along the up/down direction (the vertical direction) and which accepts a nozzle 8 described later, within a rim portion of the atmosphere blocking plate 9. Since the through hole 9e is formed opposed against the rim portion TR of the front surface Wf of the substrate (FIG. 1) which is held at the spin base 3, insertion of the nozzle 8 in the through hole 9e results in positioning of the nozzle 8 opposed against the rim portion TR of the front surface Wf. The diameter of the through hole 9e is a minimum necessary diameter which yet permits insertion of the nozzle 8. This is to prevent inconvenience such as splash of a processing liquid due to the through hole 9e, which will be caused by an excessively large diameter of the through hole 9e beyond the necessity.

The atmosphere blocking plate 9 is located above the spin base 3, and the lower surface (bottom surface) of the atmosphere blocking plate 9 is an opposed surface 9a which is opposed against the substrate's front surface Wf. Gas ejection outlets 9b and 90b are formed in the opposed surface 9a. The gas ejection outlets 9b are located at positions corresponding to the support pins 6 disposed to the spin base 3, to be exact, at equidistant positions on the trajectory of rotations of the support pins 6 along the circumference about the center of rotations A0. Meanwhile, the gas ejection outlets 90b are arranged closer to the center of the atmosphere blocking plate 9 (the center of rotations A0) than the through hole 9e are, as to surround the through hole 9e. These gas ejection outlets 9b and 90b are not limited to plural openings. For example, the plural gas ejection outlets 9b (or 90b) may be linked with each other into one opening. Further, all gas ejection outlets 9b and 90b may be linked with each other all along the circumference into a rink-shaped opening.

Referring back to FIG. 1, the gas ejection outlets 9b and 90b link respectively to gas distribution spaces 9c and 90c which are formed inside the atmosphere blocking plate 9. To supply nitrogen gas to the gas distribution spaces 9c and 90c, the gas distribution spaces 9c and 90c are connected with the gas supply unit 21. Hence, as the gas supply unit 21 supplies nitrogen gas to the gas distribution spaces 9c and 90c, nitrogen gas is ejected toward the substrate's front surface Wf from the plural gas ejection outlets 9b and 90b. In addition, of the plural gas ejection outlets 9b and 90b which are formed in the opposed surface 9a of the atmosphere blocking plate 9 so as to be on the trajectory of rotations of the support pins 6, the gas ejection outlets 9b are formed so that nitrogen gas will be injected approximately vertically toward the substrate's front surface Wf, whereas the gas ejection outlets 90b are formed so that nitrogen gas will be injected downward and outward along the diameter direction toward the substrate's front surface Wf. Uniform ejection of nitrogen gas at these gas ejection outlets 9b and 90b uniformly presses the substrate W against the support pins 6 which project upward from the spin base 3.

The structure and operations of the nozzle 8 will now be described. The nozzle 8 is shaped like a cylinder in accordance with the shape of the through hole 9e, and when the nozzle 8 is inserted in the through hole 9e, the tip of the nozzle 8 becomes opposed against the rim portion TR of the front surface Wf. The bottom surface of the tip of the nozzle 8 is inserted to a position which is flush with the opposed surface 9a of the atmosphere blocking plate 9. This makes it possible to supply the processing liquid to the rim portion TR of the front surface Wf from the nozzle 8. In other words, a chemical solution pipe 81 and a rinsing liquid pipe 83 are disposed inside the nozzle 8, and the chemical solution pipe 81 is connected with a chemical solution supply unit 22 while the rinsing liquid pipe 83 is connected with a rinsing liquid supply unit 23. Hence, as the chemical solution supply unit 22 pumps out the chemical solution in response to an operation command from the control unit 4, the chemical solution is ejected toward the rim portion TR of the front surface Wf from the chemical solution pipe 81. When the rinsing liquid supply unit 23 pumps out the rinsing liquid, the rinsing liquid is ejected toward the rim portion TR of the front surface Wf from the rinsing liquid pipe 83.

A description will now be given on a relationship between the position of the rim processing area TR and supplying positions, at which nitrogen gas is ejected from the gas ejection outlets 9b and 90b formed in the opposed surface 9a of the atmosphere blocking plate 9, during processing of the rim portion (rim processing area) TR of the substrate's front surface Wf with supply of the processing liquid from the nozzle 8. Injected from the gas ejection outlets 9b toward the substrate's front surface Wf approximately vertically and injected from the gas ejection outlets 90b toward the substrate's front surface Wf downward and outward along the diameter direction, nitrogen gas is supplied to a non-processing area NTR which is located on the inner side than the rim processing area TR which is treated with the processing liquid from the nozzle 8. This prevents the processing liquid from entering the non-processing area NTR and hence realizes uniform processing over the rim etching width along the circumference of the substrate.

Further, the nozzle 8 is fixed to the tip end of one arm 85 (FIG. 2). Linked with a base part of the arm 85 is a nozzle moving mechanism 87. When the nozzle moving mechanism 87 operates in response to an operation command from the control unit 4, the arm 85 moves up and down, and pivots about an axis of rotations P0. The nozzle 8 can move between a supplying position P11 (denoted by the solid line in FIGS. 1 and 2) at which the nozzle 8 can supply the processing liquid to the rim processing area TR of the substrate's front surface Wf while remaining opposed against the substrate W, by inserted into the through hole 9e of the atmosphere blocking plate 9, and a retract position P12 (denoted by the broken line in FIGS. 1 and 2) at which the nozzle 8 has moved upward from the supplying position P11 and retracted sideways.

In addition, there is a gas inlet 9d in the inner wall of the through hole 9e of the atmosphere blocking plate 9, and the gas inlet 9d is connected with the gas distribution space 90c. As the gas supply unit 21 supplies nitrogen gas therefore, nitrogen gas is ejected toward the top surface of the substrate W from the gas ejection outlets 9b and 90b, and nitrogen gas is introduced into the internal space in the through hole 9e at the same time. Hence, in a condition that the nozzle 8 is at the retract position P12, that is, without insertion of the nozzle 8 in the through hole 9e, the gas supply unit 21 introduces nitrogen gas into the through hole 9e and nitrogen is ejected from the top and the bottom openings of the through hole 9e of the atmosphere blocking plate 9.

An upper cleaning nozzle 12 is disposed coaxially in the opening at the center of the atmosphere blocking plate 9 and inside the hollow section of the support shaft 11 so that it is possible to supply, at a nozzle outlet 12a at the bottom end of the upper cleaning nozzle 12, the processing liquid (the chemical solution or the rinsing liquid such as pure water) to an area at and close to the center of rotations within the top surface of the substrate W which is pressed against and held by the spin base 3. The upper cleaning nozzle 12 is connected with the chemical solution supply unit 22 and the rinsing liquid supply unit 23, so as to selectively supply the chemical solution or the rinsing liquid.

The gap between the inner wall surface of the hollow section of the support shaft 11 and the outer wall surface of the upper cleaning nozzle 12 is a gas supply path 13. The gas supply path 13 is connected with the gas supply unit 21, and nitrogen gas is ejected from the gas supply path 13 into the space created between the substrate's front surface Wf and the opposed surface 9*a* of the atmosphere blocking plate 9. This increases the pressure in the space between the substrate's front surface Wf and the opposed surface 9*a* of the atmosphere blocking plate 9, whereby the substrate W is pushed against at least the plural support pins 5 or the plural support pins 6 and securely held at the spin base 3 while blocking the central section of the substrate's front surface Wf from an outside atmosphere. In this embodiment, the opposed surface 9*a* of the atmosphere blocking plate 9, the gas ejection outlets 9*b* and 90*b*, the gas supply path 13 and the gas supply unit 21 function as the "pressing unit" of the invention.

A lower cleaning nozzle 31 is disposed coaxially in the hollow section of the rotation shaft 1 so that it is possible to supply, at a nozzle outlet 31*a* at the top end of the lower cleaning nozzle 31, the processing liquid to an area at and close to the center of rotations within the substrate's back surface Wb. Like the upper cleaning nozzle 12, the lower cleaning nozzle 31 is connected with the chemical solution supply unit 22 and the rinsing liquid supply unit 23, so as to selectively supply the chemical solution or the rinsing liquid.

The gap between the inner wall surface of the rotation shaft 1 and the outer wall surface of the lower cleaning nozzle 31 defines a cylindrical gas supply path 33. The gas supply path 33 is connected with the gas supply unit 21, and nitrogen gas is ejected from the gas supply path 33 into the space created between the substrate's back surface Wb and the opposed surface of the spin base 3.

Figure 8:
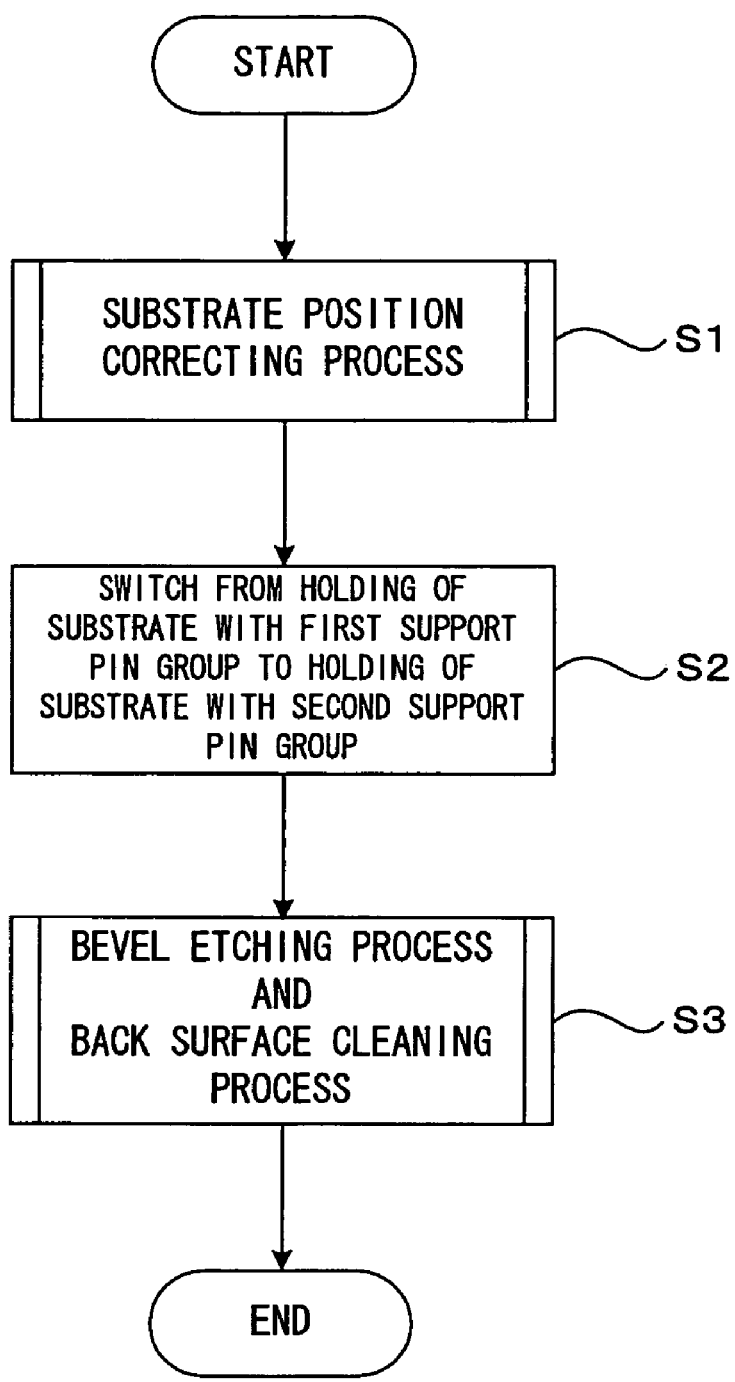
FIG. 8 is a flow chart which illustrates operations of the substrate processing apparatus which is shown in FIG. 1.
Figure 9A:
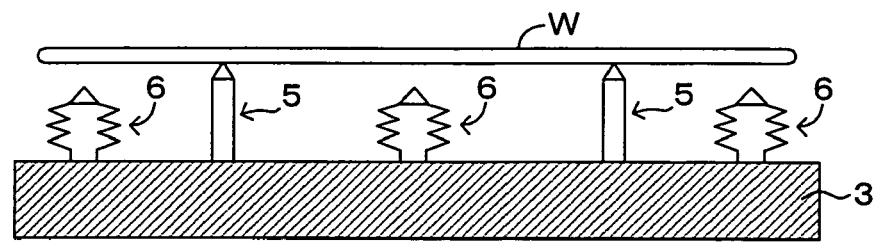
FIGS. 9A, 9B, 9C and 9D are drawings which show the state of the support pins in the substrate processing apparatus which is shown in FIG. 1.

Operations of the substrate processing apparatus having this structure will now be described with reference to FIGS. 8 through 14B. FIG. 8 is a flow chart which illustrates operations of the substrate processing apparatus which is shown in FIG. 1. FIGS. 9A, 9B, 9C and 9D are drawings which show the state of the support pins in the substrate processing apparatus which is shown in FIG. 1. In this substrate processing apparatus, carried the substrate W, whose front surface Wf bears thin films such as metal layers and photo resist layers, into the apparatus in a condition that the substrate's front surface Wf is directed toward above, substrate position correcting process is executed (Step S1) upon the substrate W. To be more specific, a series of processing shown in the flow chart in FIG. 10 is carried out. At the time of loading and unloading of the substrate W and the substrate position correcting process, the atmosphere blocking plate 9 and the support shaft 11 retract as one integrated unit to above the spin base 3.

Figure 10:
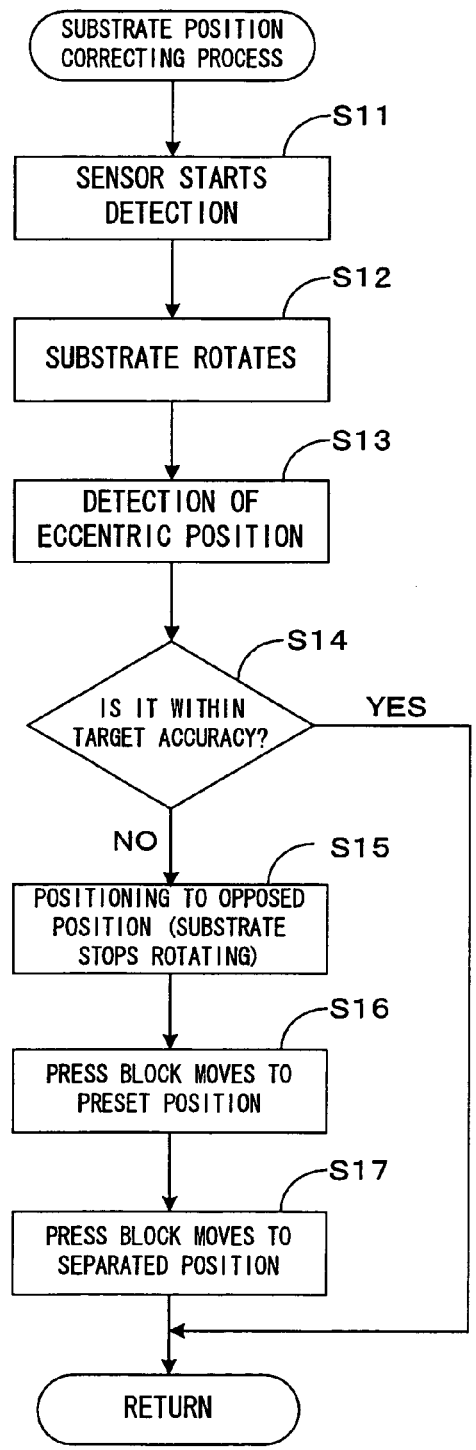
FIG. 10 is a flow chart which illustrates operations of the substrate position correcting apparatus which is shown in FIG. 4.
Figure 11A:
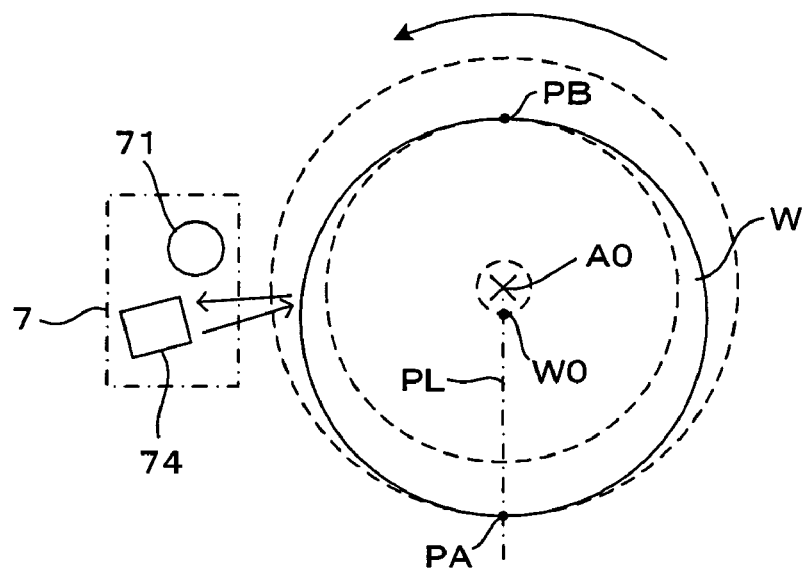
FIGS. 11A and 11B are drawings for describing the operations of the substrate position correcting apparatus which is shown in FIG. 4.
Figure 11B:
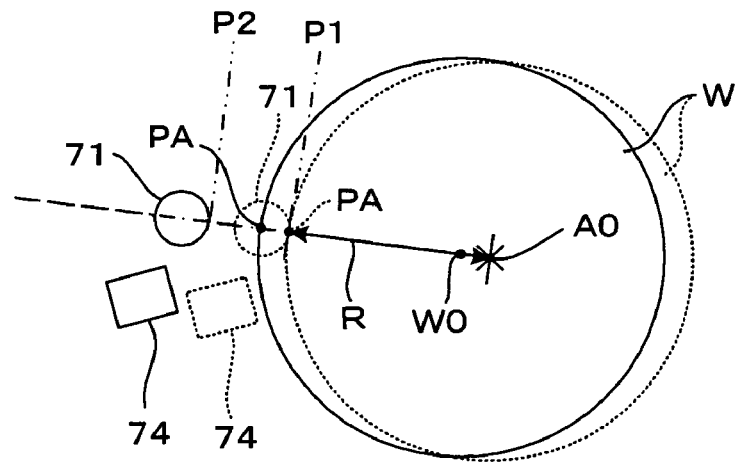

FIG. 10 is a flow chart which shows operations of the substrate position correcting apparatus which is shown in FIG. 4. FIGS. 11A and 11B are drawings for describing the operations of the substrate position correcting apparatus which is shown in FIG. 4. First, the first support pin group alone consisting of the plural support pins 5 supports the substrate W as the transporter such as a transportation robot puts the substrate W on the spin base 3, and the detection sensor 74 starts detecting the distance to the edge surface of the substrate W (Step S11). At this stage, as shown in FIG. 9A, the abutting parts 61 of the support pins 6 are each located at a position which is lower than the abutting position at which the support pins 5 abut on the bottom surface of the substrate W, so that the first support pin group alone supports the substrate W in such a fashion that the substrate W can freely slide along the horizontal direction. In short, since the substrate W is supported by the support pins 5 whose coefficient of friction against the bottom surface of the substrate W is smaller than the coefficient of friction of the support pins 6, when acted upon by external force, the substrate W easily slide along the horizontal direction. The press block 71 (and the detection sensor 74) is located at the separated position P2 which is away sidewise from the substrate W, preventing interference with the substrate W.

While the detection sensor 74 continues its detection, the control unit 4 activates the rotary drive mechanism 2 and accordingly makes the substrate rotate (Step S12). The substrate W, held by the support pins 5 due to the force of friction developing between the bottom surface of the substrate W and the support pins 5, rotates about the center of rotations A0 (rotating step). The rotation position detector incorporated within the rotary drive mechanism 2 detects the rotation position of the spin base 3, and the rotation position is fed to the control unit 4. The circumferential position of the substrate W and the distance to the edge surface of the substrate W are thus measured along the circumference of the substrate W, which measurement result is as shown in FIG. 12.

Figure 12:
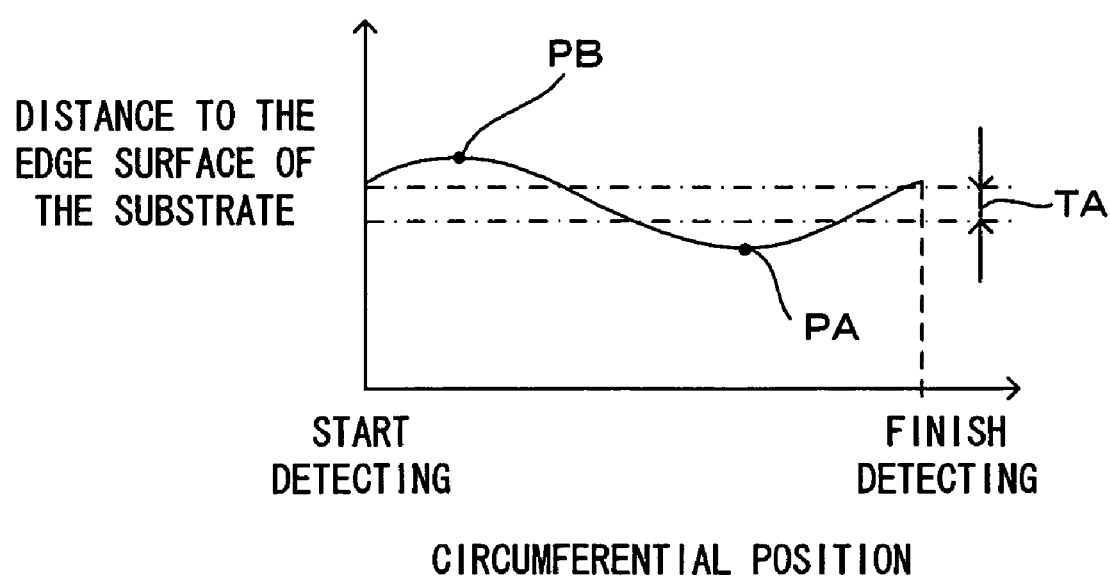
FIG. 12 is a graph which shows the result of detection by a detection sensor.

FIG. 12 is a graph which shows the result of detection by the detection sensor. To be exact, this is a graph which shows the distance from the detection sensor 74 to the edge surface of the substrate W which varies in accordance with the circumferential position of the substrate W as the substrate W rotates approximately one round. As shown in FIG. 12, when there is deviation (eccentricity) between the center of rotations A0 and the center W0 of the substrate, the distance from the detection sensor 74 to the edge surface of the substrate W changes, and a minimum point PA and a maximum point PB are detected at which this distance is the shortest and the longest respectively. The minimum point PA corresponds to the farthest position of the edge surface from the center of rotations A0 (i.e., eccentric position), namely, the point of intersection between the outer diameter of the substrate W and a virtual line PL which extends along the direction from the center of rotations A0 toward the center W0 of the substrate (i.e., eccentric direction), as shown in FIG. 11A. In accordance with a signal received from the rotation position detector and a detection signal from the detection sensor 74, the control unit 4 calculates the eccentric position PA (position along the direction of rotation) (detection step; Step S13).

The control unit 4 judges whether the distance between the minimum point (eccentric position) PA and the maximum point PB is within the range of the target accuracy TA (Step S14). When the distance is within the range of the target accuracy TA (YES at Step S14), the control unit 4 ends the processing without correcting the position of the substrate W. On the contrary, when the distance is outside the range of the target accuracy TA (NO at Step S14), the control unit 4 performs correction of the position of the substrate W.

For correction of the position of the substrate W (NO at Step S14), the control unit 4 makes the substrate W rotate so that the eccentric position PA comes opposed against the press block 71 (i.e., the position of the substrate W denoted by the solid line in FIG. 11B). The substrate W is stopped rotating and positioned at this opposed position (positioning step; Step S15).

The control unit 4 then activates the block moving mechanism 73 and accordingly drives the press block 71, pressing the abutting section 71a (the side surface of the press block 71) to the preset position P1 (the position denoted by the broken line in FIG. 11B) along the direction toward the center of rotations A0 (pressing step; Step S16). Since the substrate W is supported for free sliding by the support pins 5 at this stage, as the press block 71 pushes the substrate W with greater force than the force of friction developing between the bottom surface of the substrate W and the support pins 5, the substrate W slides horizontally on the support pins 5 while remaining abutting on the press block 71. The substrate W is pushed by the press block 71, and the eccentric position PA is aligned to the preset position P1. In this example, the preset position P1 is a position which is away from the center of rotations A0 along the horizontal direction by the distance R calculated by adding the positive tolerance value for the target accuracy TA to the radius of the substrate W. Hence, matching of the eccentric position PA with the preset position P1 corrects the position of the substrate W so that the distance from the center of rotations A0 to the center W0 of the substrate remains within the target accuracy TA.

Upon correction of the position of the substrate W in this manner, the control unit 4 drives the block moving mechanism 73, thereby retracting the press block 71 back to the separated position P2 which is away sidewise from the substrate W (Step S17). The substrate W whose position is thus corrected may then be fixed by a chuck mechanism not shown on the spin base 3 for wet processing with a liquid while rotated by the spin base 3, or inspected by an inspection mechanism not shown on the spin base 3.

Figure 9B:
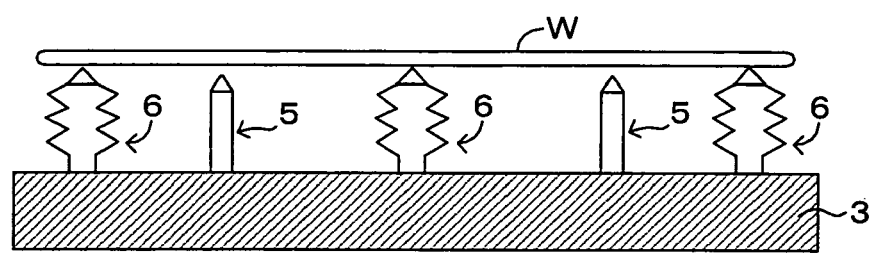

As the substrate position correcting process completes, as shown in FIG. 9B, the control unit 4 drives the elevating drivers 63, whereby the abutting parts 61 of the plural support pins 6 are set to a position which is higher than the abutting position at which the support pins 5 abut on the bottom surface of the substrate W. The abutting parts 52 of the support pins 5 therefore move away from the bottom surface of the substrate W, and the substrate W becomes supported only by the second support pin group consisting of the plural support pins 6 (Step S2). That is, supporting of the substrate by means of the support pins 5 whose coefficient of friction against the bottom surface of the substrate W is relatively small is replaced with supporting of the substrate by means of the support pins 6 whose coefficient is relatively large. This suppresses sliding of the substrate W along the horizontal direction and permits the spin base 3 to stably hold the substrate.

The substrate W now supported by the plural support pins 6 is subjected to bevel etching process (etching+rinsing+drying) and back surface cleaning process at the same time (Step S3). To be more specific, a series of process shown in the flow chart in FIG. 13 is carried out.

Figure 13:
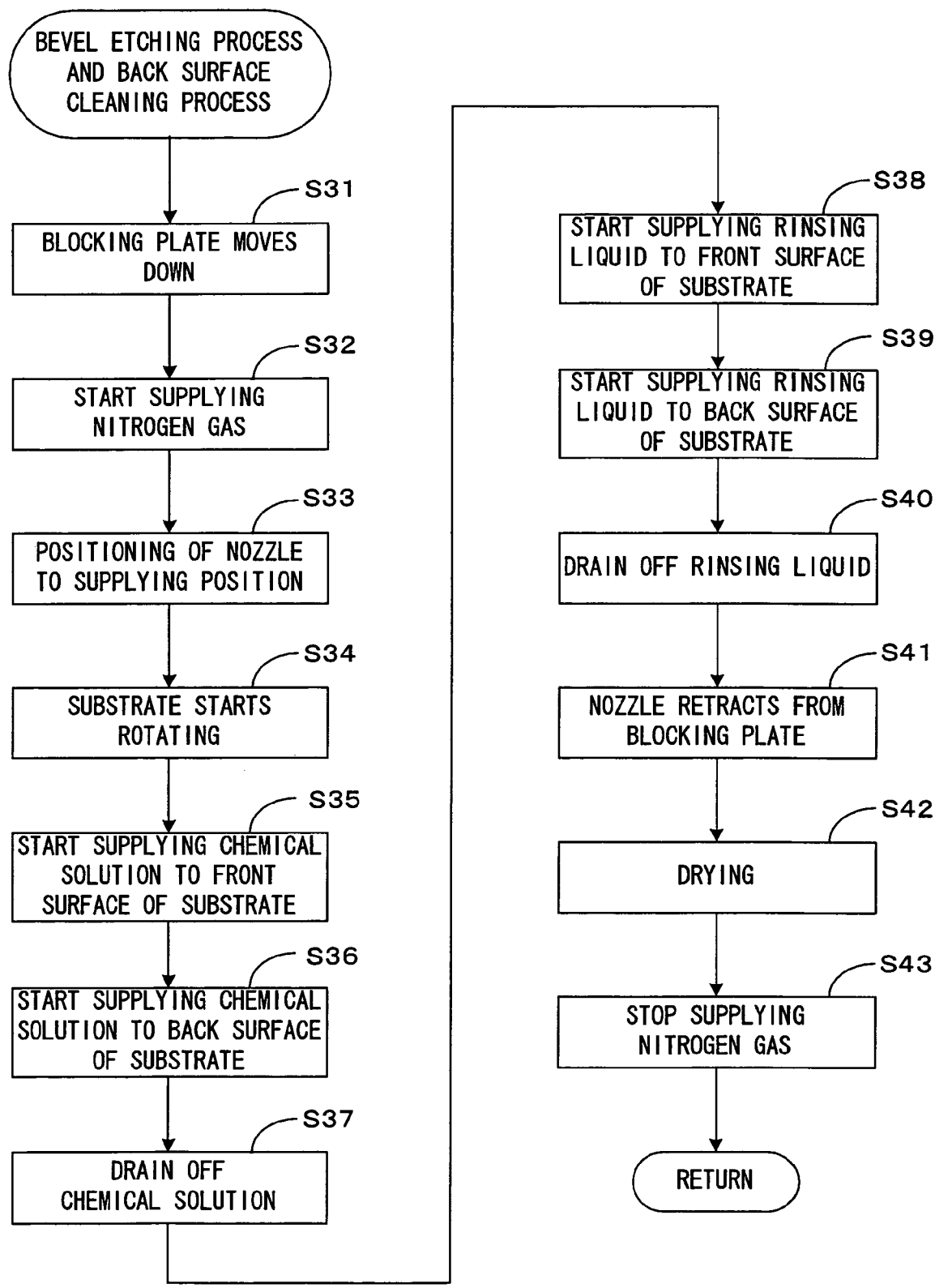
FIG. 13 is a flow chart which illustrates operations during bevel etching process and back surface cleaning process.
Figure 14A:
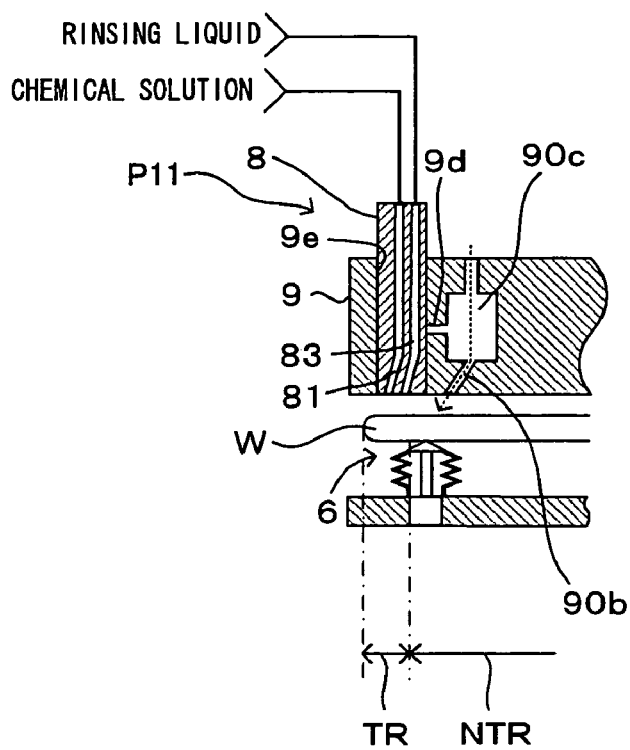
FIGS. 14A and 14B are drawings which show the state of a nozzle of the substrate processing apparatus which is shown in FIG. 1.
Figure 14B:
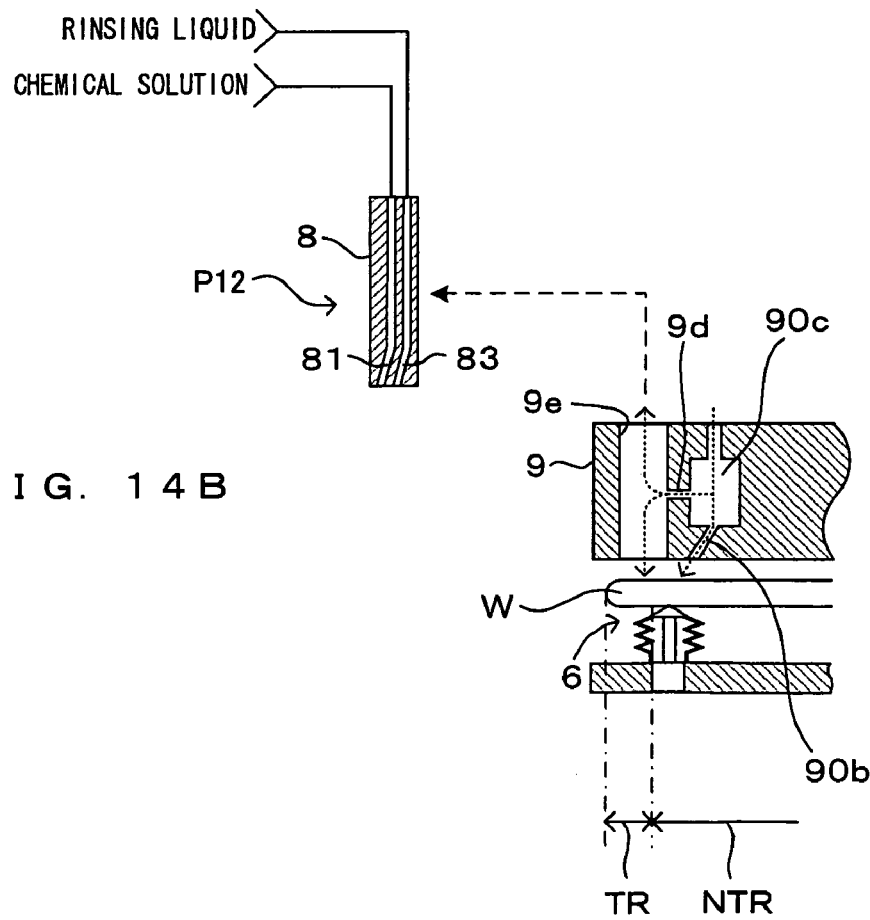

FIG. 13 is a flow chart which illustrates operations during bevel etching process and back surface cleaning process. FIGS. 14A and 14B are drawings which show the state of the nozzle 8 of the substrate processing apparatus which is shown in FIG. 1. First, the control unit 4 makes the actuator of the blocking plate drive mechanism 15 descend, thereby moving down the atmosphere blocking plate 9 and the support shaft 11 as one integrated unit and positioning the atmosphere blocking plate 9 close to the substrate W (Step S31). The substrate's front surface Wf (surface where a device is to be formed) is consequently placed very close to and capped with the opposed surface 9a of the atmosphere blocking plate 9, and is securely protected against an outside atmosphere surrounding the substrate.

The control unit 4 then makes the gas supply unit 21 eject nitrogen gas uniformly from the gas ejection outlets 9b and 90b which are formed in the opposed surface 9a of the atmosphere blocking plate 9, and the substrate W is pressed against the support pins 6 and held by the spin base 3 (Step S32). Nitrogen gas injected from the gas ejection outlets 9b and 90b heads toward the non-processing area NTR which is located on the inner side than the rim processing area TR. It is therefore ideal at this stage to supply nitrogen gas also from the gas supply path 13 into the space between the substrate's front surface Wf and the opposed surface 9a of the atmosphere blocking plate 9 and accordingly increase the pressure inside this space. This makes it possible to securely press the substrate W against the support pins 6 and hold the substrate at the spin base 3.

Next, the control unit 4 activates the nozzle moving mechanism 87, whereby the nozzle 8 goes into the through hole 9e of the atmosphere blocking plate 9 and is positioned at the supplying position P11 as shown in FIG. 14A (Step S33). Following this, the control unit 4 drives the rotary drive mechanism 2 while maintaining the atmosphere blocking plate 9 in a halt, thereby rotating the substrate W together with the spin base 3 (Step S34). At this stage, the substrate W pressed to the support pins 6 rotates with the spin base 3, as it is supported by the support pins 6, owing to the force of friction developing between the support pins 6 and the substrate W.

The nozzle 8 thereafter supplies the chemical solution to the rim portion TR of the substrate's front surface Wf (Step S35). Since the center W0 of the substrate is aligned to the center of rotations A0, the distance between of the edge surface the rotating substrate W and the nozzle 8 is constant. Further, since nitrogen gas ejected from the gas ejection outlets 9b and 90b is supplied to the non-processing area NTR which is located on the inner side than the rim processing area TR, the chemical solution will never reach the non-processing area NTR. This secures uniform supply of the chemical solution over the predetermined width from the circumferential edge surface of the substrate W all along the circumference of the rim portion TR of the substrate's front surface Wf, and attains chemical solution processing over the uniform rim etching width.

Figure 9C:
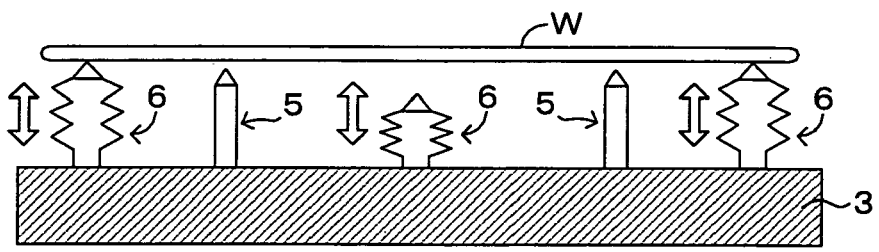

After supply of the chemical solution to the rim portion TR of the substrate's front surface Wf, the control unit 4 makes the chemical solution from the chemical solution supply unit 22 supplied toward the central section of the substrate's back surface Wb (bottom surface) from the nozzle outlet 31a of the lower cleaning nozzle 31 (Step S36). Owing to centrifugal force which is created as the substrate W rotates, the chemical solution supplied to the central section of the substrate's back surface Wb spreads all over the back surface, thereby cleaning the back surface of the substrate W. During the chemical solution processing, each one of the plural support pins 6 moves away from the bottom surface of the substrate W at least once or more times as shown in FIG. 9C, whereby the chemical solution reaches the contact portions where the support pins 6 abut on the substrate W and the contact portions are processed. To this effect, for instance, the plural support pins 6 may move away one at a time in turn, the second support pin group consisting of the plural support pins 6 may be divided into two groups which may then support the substrate alternately. To be more specific, one of the groups alone supports first, the both groups then support, and the other one of the groups lastly supports. As the substrate W is supported in this manner, the substrate's back surface Wb never contacts the support pins 5 which are fixed on the spin base 3. This leaves no unprocessed portion and realizes excellent processing of the entire back surface of the substrate W.

The back surface processing is not processing to occur only after the chemical solution processing of the rim portion TR of the substrate's front surface Wf. Instead, the back surface processing may be performed during the chemical solution processing of the rim portion TR of the substrate's front surface Wf or in partial overlap with the chemical solution processing of the rim portion TR of the substrate's front surface Wf. After the chemical solution processing for a predetermined period of time, the control unit 4 stops supply of the chemical solution from the chemical solution supply unit 22 while maintaining the substrate W in rotations, whereby the chemical solution is drained off and discharged to outside the substrate (Step S37).

Since the nozzle 8 is in the through hole 9e of the atmosphere blocking plate 9 at this stage, the opposed surface 9a of the atmosphere blocking plate 9 blocks even the chemical solution splashed and jumping back to the nozzle 8 and therefore the chemical solution will never adhere to the wall (side surface) of the nozzle 8. This prevents the chemical solution from dropping off from the nozzle 8 while the nozzle moves and so adhering to the substrate W or the members around the same and exerting an adverse influence. The nozzle 8 therefore needs no cleaning, which improves the throughput of the apparatus.

In addition, although the chemical solution supplied to the rim portion TR of the substrate's front surface Wf and the substrate's back surface Wb is scattered outward along the diameter direction of the substrate W, since this embodiment uses no holding member such as a chuck pin to hold the substrate W at the rim portion of the substrate W, the chemical solution heading outward along the diameter direction of the substrate W will not jump back to the central section of the substrate's front surface Wf Further, since there is nothing which disturbs air flows near the edge surface the substrate W, blowing up of the mist-like chemical solution to the substrate's front surface is reduced. It is thus possible to prevent the chemical solution from jumping back to the non-processing area NTR in the substrate's front surface Wf and avoid corrosion of the central section (non-processing section) of the substrate's front surface Wf. Prevention of blowing up of the mist-like chemical solution suppresses adhesion of particles to the substrate W.

As the chemical solution is drained off, the rinsing liquid (pure water, DIW, etc.) is supplied from the nozzle 8 to the rim portion TR of the substrate's front surface Wf by a command from the control unit 4 (Step S38). As a result, the chemical solution adhering to the rim portion TR of the substrate's front surface Wf is washed off with the rinsing liquid. Further, the control unit 4 performs rinsing of the substrate's back surface Wb as well after rinsing of the rim portion TR of the substrate's front surface Wf, during rinsing of the rim portion TR of the substrate's front surface Wf, or in partial overlap with rinsing of the rim portion TR of the substrate's front surface Wf (Step S39). After rinsing for a predetermined period of time, the control unit 4 stops supply of the rinsing liquid, whereby the rinsing liquid is drained off and discharged to outside the substrate (Step S40).

Next, the control unit 4 activates the nozzle moving mechanism 87, thereby pulling out the nozzle 8 from the through hole 9e and setting the nozzle 8 to the retract position P12 which is away from the atmosphere blocking plate 9 (Step S41). The substrate W then rotates at a high speed and is accordingly dried (Step S42). The substrate W is thus drained off of liquid components adhering to the substrate W, owing to centrifugal force. At this stage, the motor of the blocking plate drive mechanism 15 operates, the atmosphere blocking plate 9 rotates with the support shaft 11 about the vertical axis along the same direction as that of rotations of the substrate W, and the processing liquid adhering to the atmosphere blocking plate 9 is drained off, which achieves effective spin drying. Further, as the substrate W rotates together with the atmosphere blocking plate 9, the rotations will not create excessive air flows between the substrate W and the atmosphere blocking plate 9. During this drying process, the control unit 4 introduces nitrogen gas from the gas supply unit 21 into the space between the bottom surface of the substrate W and the opposed surface of the spin base 3 and also into the space between the top surface of the substrate W and the opposed surface 9a of the atmosphere blocking plate 9. Since this attains quick replacement of the spaces surrounding the substrate W with nitrogen gas, the chemical solution atmosphere remaining within the space will never contaminate the substrate W. Further, an unwanted oxide film will not grow on the top or the bottom surface of the substrate W.

As the nozzle 8 is positioned at the retract position P12 and pulled out from the through hole 9e, nitrogen gas introduced into the through hole 9e from the gas inlet 9d strongly gushes out from the top and the bottom openings of the through hole 9e of the atmosphere blocking plate 9 (FIG. 14B). Hence, even with the nozzle 8 pulled out from the through hole 9e, the rinsing liquid will not enter the through hole 9e and jump back to the substrate W. Jumping back attributable to the through hole 9e is thus suppressed, which prevents corrosion of the central section (non-processing area NTR) of the substrate's front surface Wf.

Figure 9D:
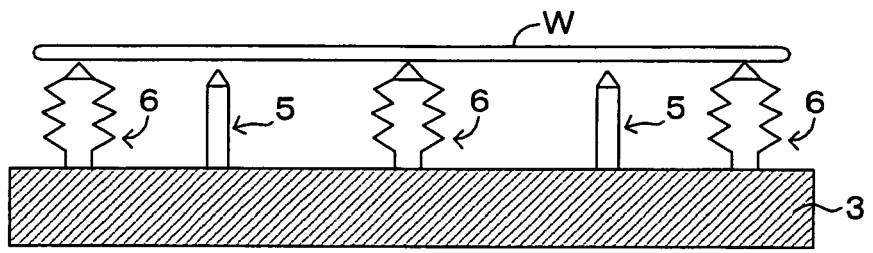

After drying, the control unit 4 stops driving the rotary drive mechanism 2, thereby stopping the substrate W from rotating, and also stops the motor of the blocking plate drive mechanism 15, thereby stopping the atmosphere blocking plate 9 from rotating. The control unit 4 then stops gas supply from the gas supply unit 21 and releases the substrate W from pressing and holding (Step S43). The atmosphere blocking plate 9 thereafter moves up, and the transportation robot unloads the processed substrate W. For unloading of the substrate W, the transportation robot may receive the substrate W as it is supported by the second support pin group consisting of the plural support pins 6 as shown in FIG. 9D, or alternatively, the substrate W may be surrendered to the first support pin group consisting of the plural support pins 5 and the transportation robot may receive the substrate W as it is supported by the first support pin group. This completes the chemical solution processing and rinsing.

As described above, since the substrate W is held utilizing the force of friction developing between the support pins 5, 6 and the substrate W in this embodiment, this embodiment does not require any holding member such as a chuck pin which abuts on the edge surface of the substrate W and holds the substrate W. It is therefore possible to prevent an adverse influence over the substrate W attributable to holding of the substrate. To be more specific, it is possible to prevent the chemical solution supplied to the rim portion TR of the substrate's front surface Wf from hitting and jumping back at a holding member and corroding the central section (non-processing section) of the substrate's front surface Wf. Further, the absence of a factor which disturbs air flows near the edge surface the substrate W reduces blowing up of the mist-like chemical solution to the substrate's front surface, which effectively prevents adhesion of the chemical solution to the central section of the substrate's front surface Wf.

In addition, since the substrate W is supported for free sliding by the support pins 5 according to the embodiment, the substrate W, subjected to greater horizontal force than the force of friction developing between the bottom surface of the substrate W and the support pins 5, can move along the horizontal direction. As the press block 71 exerts the greater force than the above force of friction along the horizontal direction, the substrate W slides toward the center of rotations A0 of the spin base 3 and the position of the substrate W along the horizontal direction is corrected. Without a holding member such as a chuck pin which abuts on the edge surface the substrate W therefore, it is possible to align the center W0 of the substrate to the center of rotations A0 and process the substrate W as it remains accurately positioned.

Further, the embodiment uses the first support pin group consisting of the plural support pins 5 and the second support pin group consisting of the plural support pins 6 whose coefficient of friction against the bottom surface of the substrate W is larger than that of the plural support pins 5. The first support pin group alone abuts on the bottom surface of the substrate W, for the position correcting unit 7 to correct the position of the substrate W along the horizontal direction. On the other hand, for predetermined processing such as etching of the substrate W, the second support pin group alone abuts on the bottom surface of the substrate W. As the first support pin group alone, whose coefficient of friction against the bottom surface of the substrate W is relatively small, abuts on the bottom surface of the substrate W for correction of the position of the substrate W, the substrate W smoothly slides and is easily positioned during a relatively short period of time. During this, the bottom surface of the substrate W is protected against damaging, particles, etc. The second support pin group, whose coefficient of friction against the bottom surface of the substrate W is relatively large, abuts on the bottom surface of the substrate W for predetermined processing such as etching of the substrate W, which makes it possible to stably hold and rotate the substrate W and securely prevent the substrate W from getting displaced during the processing.

Further, according to the embodiment, for predetermined processing such as etching of the substrate W, nitrogen gas is supplied to the substrate's front surface Wf (top surface) and the substrate W is pressed against the support pins 6. This increases the force of friction which is created between the substrate's back surface Wb (bottom surface) and the support pins 6, and attains more stable holding and rotations of the substrate W.

Further, the substrate W is held and rotates owing to the force of friction developing between the bottom surface of the substrate W and the support pins 5, while supported for free sliding by the support pins 5, according to the embodiment. After detection of the farthest position (eccentric position) PA of the edge surface of the substrate W from the center of rotations A0 of the spin base 3 during rotations of the substrate W, the press block 71 pushes the eccentric position PA to the preset position P1. The center W0 of the substrate is consequently positioned within the predetermined range from the center of rotations A0. Since the support pins 5 support the substrate W in such a manner that the substrate W which is held and rotating can freely slide, pushing of the substrate W by the press block 71 is sufficient and any huge mechanism such as a centering mechanism of a conventional apparatus is not necessary. The apparatus is therefore space-saving and low cost and has a simple structure which realizes accurate positioning.

Since the structure is simple according to the embodiment, even when there is a restriction over an installation space inside a processing area such as a processing chamber for processing the substrate W, the apparatus can be easily installed within the processing area. Installation within a processing area demands the resistance against chemical solutions. Chemical-resistant treatment of a centering mechanism of a conventional apparatus has a problem of a further cost increase, as the mechanism comprises a number of drive systems for the sake of holding the substrate W at the edge of the substrate. In contrast, the simple structure according to the embodiment which does not comprise many drive systems permits chemical-resistant treatment at an inexpensive cost.

Further, for correction of the position of the substrate W, the press block 71 abuts on the substrate W which remains supported for free sliding by the support pins 5 according to the embodiment, and hence, the following advantages are promised unlike where a centering mechanism of a conventional apparatus holds the substrate W at the edge of the substrate and the position of the substrate W is corrected. That is, in the event that the position of the substrate W is corrected while the substrate W is held at its edge, external force acts upon central sections of the substrate W from both sides of the substrate W, and therefore, application of excessive force upon the substrate W could damage the substrate W. In contrast, since the position is corrected while the support pins 5 support the substrate W such that the substrate W can freely slide in the embodiment, excessive force will never be applied upon the substrate W, which minimizes an impact upon the substrate W and prevents damaging of the substrate W.

<Substrate Position Correcting Apparatus According to Second Embodiment>

FIG. 15 is a drawing which shows other structure of the position correcting mechanism disposed to the substrate processing apparatus. More specifically, FIG. 15 is a drawing which shows the second embodiment of the substrate position correcting apparatus according to the invention. A major difference of the second embodiment of the substrate position correcting apparatus from the first embodiment is that the second embodiment realizes correction of the position of the substrate W by means of the position correcting unit 7 which does not comprise the detection sensor 74. The second embodiment is otherwise basically similar in structure to the first embodiment, and therefore, the identical structures will be denoted at the same reference symbols but will not be described again.

Figure 16:
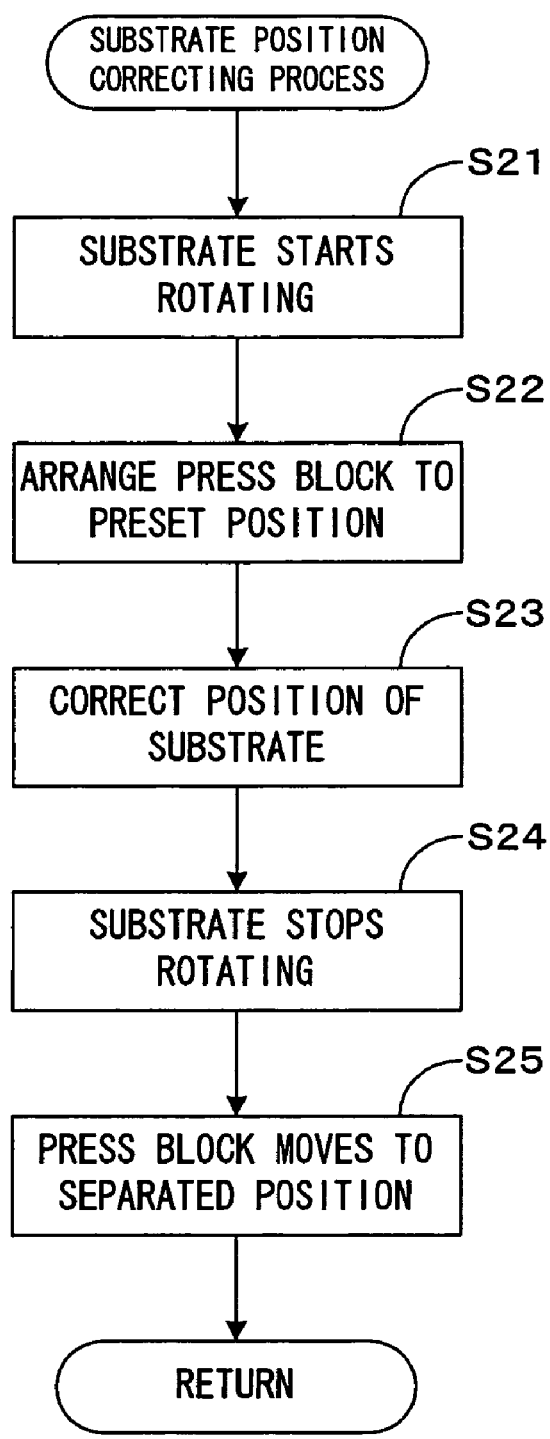
FIG. 16 is a flow chart which illustrates operations of the substrate position correcting apparatus which is shown in FIG. 15.
Figure 17A:
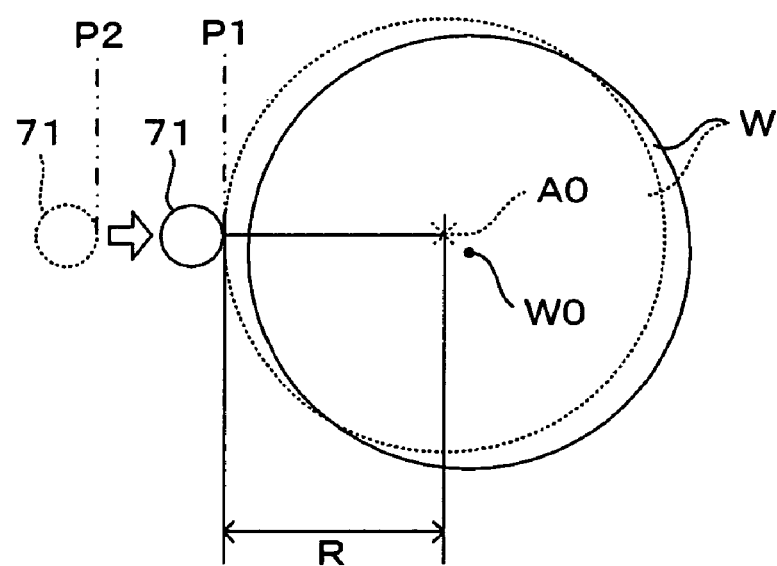
FIGS. 17A and 17B are drawings for describing the operations of the substrate position correcting apparatus which is shown in FIG. 15.
Figure 17B:
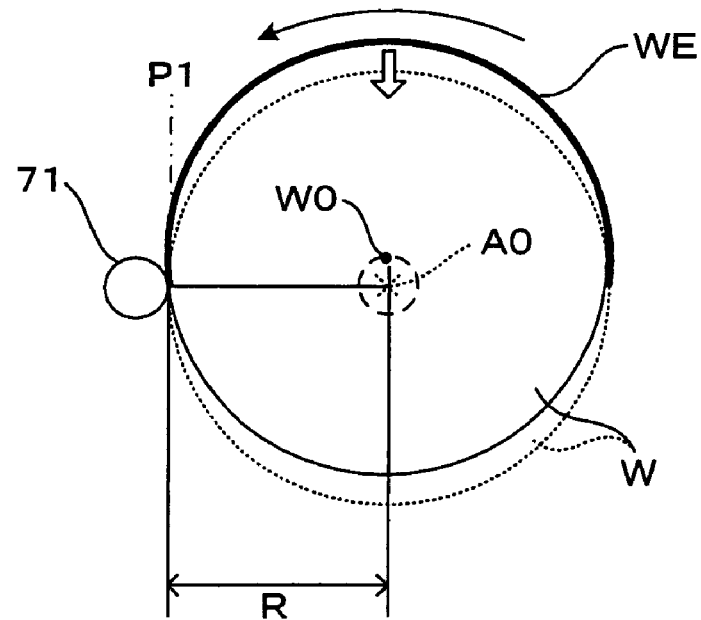

FIG. 16 is a flow chart which illustrates operations of the substrate position correcting apparatus which is shown in FIG. 15, and FIGS. 17A and 17B are drawings for describing the operations of the substrate position correcting apparatus which is shown in FIG. 15. In this embodiment, since the detection sensor 74 is not disposed, it is not possible to detect the farthest position (eccentric position) of the edge surface of the substrate W from the center of rotations A0 of the spin base 3. The position of the substrate W is corrected in the following manner instead.

First, the transporter such as a transportation robot puts the substrate W on the spin base 3 in a condition that the press block 71 is at the separated position P2 which is away sidewise from the substrate W (the position denoted by the broken line in FIG. 17A), the control unit 4 activates the rotary drive mechanism 2 and rotates the substrate W (Step S21). At this stage, the substrate W rotates about the center of rotations A0, as it is held by the support pins 5 due to the force of friction developing between the bottom surface of the substrate W and the support pins 5 (rotating step).

The control unit 4 then activates the block moving mechanism 73 and accordingly drives the press block 71, thereby positioning the abutting section 71a (the side surface of the press block 71) at the preset position P1 (the position denoted by the solid line in FIG. 17A) (arranging step; Step S22). In this example, the preset position P1 is a position which is away from the center of rotations A0 along the horizontal direction by the distance R calculated by adding the positive tolerance value for the target accuracy to the radius of the substrate W. It is to be noted at stage that any shift of the center W0 of the substrate away from the center of rotations A0 and toward the press block 71 will make the press block 71 abut on the substrate W and that the press block 71 therefore needs be driven at a sufficiently slow speed so as to suppress an impact upon the substrate W.

If the center W0 of the substrate is eccentric relative to the center of rotations A0, the fixed press block 71 serves as an obstacle against the rotating substrate W, and the position of the substrate W is corrected while the edge surface of the substrate W is rubbed on the abutting section 71a of the press block 71 (the side surface of the press block 71). To be more specific, as shown in FIG. 17B, an edge surface position WE (the portion denoted by the thick line within the edge surface of the substrate W which is denoted by the solid line in FIG. 17B), which is at the edge surface of the substrate W and on the outward side along the diameter direction than the preset position P1, abuts on the press block 71, the substrate W moves relative to the support pins 5, and the substrate W is pushed toward the center of rotations A0 of the spin base 3. As the edge surface position WE, which is on the outward side along the diameter direction than the preset position P1, abuts on the press block 71 as the substrate W rotates and the edge surface position WE is pushed toward the center of rotations A0, the position of the substrate W is corrected toward the center of rotations A0 (correcting step; Step S23). In a predetermined period of time therefore, the position of the substrate W is corrected such that the distance from the center of rotations A0 to the center W0 of the substrate is within the target accuracy.

Upon correction of the position of the substrate W, the control unit 4 stops the substrate W from rotating (Step S24), and drives the block moving mechanism 73, thereby retracting the press block 71 to the separated position P2 which is away sidewise from the substrate W (Step S25).

As in the first embodiment, after the substrate position correcting process, the control unit 4 drives the elevating drivers 63, whereby holding of the substrate with the second support pin group consisting of the plural support pins 6 takes over holding of the substrate with the first support pin group consisting of the plural support pins 5. The substrate W now supported by the plural support pins 6 is subjected to bevel etching process (etching+rinsing+drying) and back surface cleaning process.

As described above, according to the second embodiment, the substrate W is held and rotates owing to the force of friction developing between the bottom surface of the substrate W and the support pins 5, while supported for free sliding by the support pins 5, which is similar to the first embodiment. The press block 71 is arranged so that the abutting section 71a in which the press block 71 abuts on the edge surface of the substrate W is positioned to the preset position P1, and the edge surface position WE, which is at the edge surface of the rotating substrate W and on the outward side along the diameter direction than the preset position P1, is pushed in while maintained abutting on the press block 71, whereby the position of the substrate W is corrected toward the center of rotations A0. The center W0 of the substrate is consequently positioned within the predetermined range from the center of rotations A0. Since the support pins 5 support the substrate W in such a manner that the substrate W which is held and rotating can freely slide, similar effects to those according to the first embodiment are achieved. That is, the simple structure needing no huge mechanism such as a centering mechanism of a conventional apparatus realizes precise positioning. In addition, this structure which does not need any detector such as the detection sensor 74 further simplifies the structure of the apparatus.

<Others>

The invention is not limited to the embodiments described above but may be modified in various manners in addition to the embodiments above, to the extent not deviating from the object of the invention. For instance, although the embodiments described above require that the nozzle 8 is opposed against the rim portion (rim processing area) TR of the substrate's front surface Wf and the rim processing area TR is etched with the chemical solution supplied from the nozzle 8, the rim processing area TR may be etched with the chemical solution supplied to the back surface Wb of the rotating substrate W and flowing over to the rim portion TR of the substrate's front surface Wf via the edge surface of the substrate W. During such processing as well, with the center W0 of the substrate aligned to the center of rotations A0 through the substrate position correcting process, it is possible to achieve processing over the uniform rim etching width while accurately controlling the amount of the chemical solution flowing to the rim processing area TR all along the circumference of the substrate. Further, omission of a holding member such as a chuck pin which abuts on the edge surface of the substrate W and holds the substrate W obviates inconvenience that the amount in which the chemical solution is supplied becomes different between a section in the rim portion TR of the substrate's front surface Wf grasped by a holding member and the other section, and effectively prevents uneven processing.

Further, although the press block 71 is fixed to the rod 72 during the substrate position correcting process in the embodiments described above, the press block 71 may be replaced with a roller which is pivotally supported at the rod 72 and which can freely rotate about an axis of revolutions which extends along the direction of the axis of rotations of the spin base 3. In the first embodiment as it is modified as such, even when it is not possible to push the press block 71 along the direction of the center of rotations A0 of the spin base 3 due to a restriction such as a limited space around the substrate, as the roller is made follow movements of the edge surface of the substrate W, the substrate W moves toward the direction of the center of rotations A0 and the center W0 of the substrate is positioned within the predetermined range from the center of rotations A0. Meanwhile, in the second embodiment as it is modified as such, as the roller is made follow movements of the edge surface of the rotating substrate W, friction between the edge surface of the substrate W and the roller is reduced and the substrate W is prevented from moving in an unintended direction. This permits even more accurate alignment of the center W0 of the substrate to the center of rotations A0.

Figure 18:
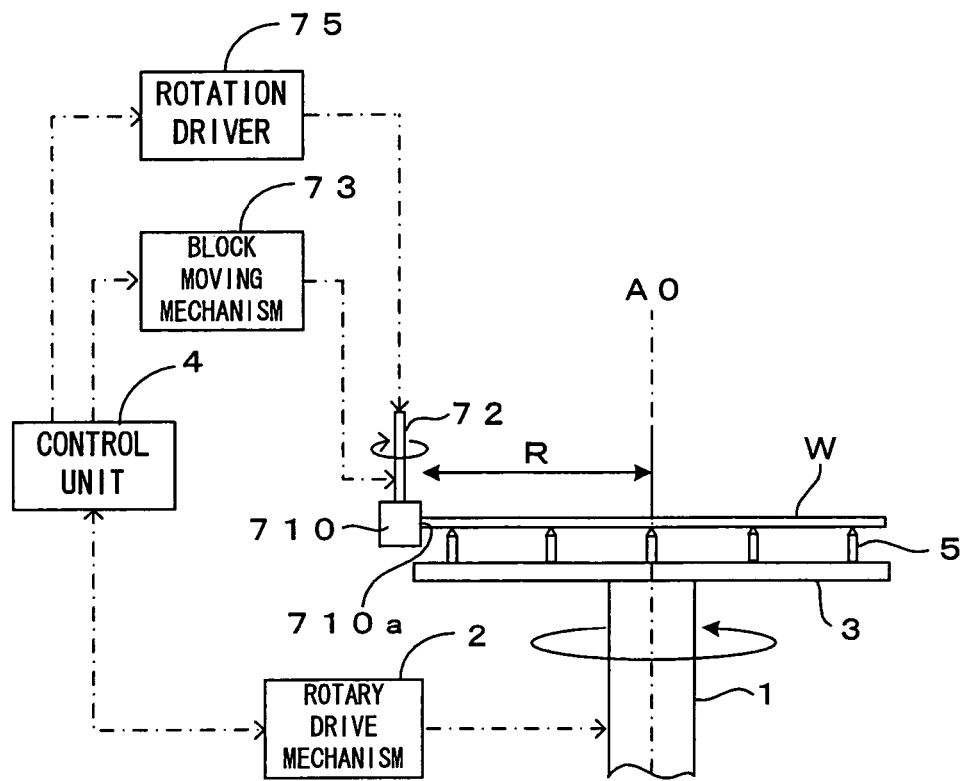
FIG. 18 is a drawing which shows modification of the substrate position correcting apparatus according to the second embodiment.

In addition, a roller may autonomously rotate in the second embodiment above. FIG. 18 is a side view which shows modification of the substrate position correcting apparatus according to the second embodiment. In this modified embodiment, a rotation driver 75 is disposed which rotates a roller 710 as shown in FIG. 18, and the rotation driver 75 rotates the roller 710 in the opposite direction (clockwise) to the direction of rotations of the substrate W but at the same circumferential speed as that of the substrate W. With this structure, it is possible to prevent a speed difference between the edge surface of the substrate W and the roller 710 and mitigate the impulsive force with which the roller 710 abuts on the edge surface of the substrate W. As the roller 710 thus autonomously rotates, even when the roller 710 can not easily follow the substrate, e.g., when an O-ring is disposed to a circumferential side surface 710a of the roller 710, friction between the edge surface of the substrate W and the roller 710 is reduced and the center W0 of the substrate is accurately aligned to the center of rotations A0 of the spin base 3.

With respect to the diameter of the circle which represents the cross section of the roller 710, for the purpose of preventing the roller 710 from fitting into the nick section such as the notch NT as in the case of the press block 71, it is desirable that the diameter of the circle is sufficiently larger than the length L of an arc which is cut away from the circumference of the substrate W by the notch NT.

Further, although the position of the substrate W is corrected as the side surface of the press block 71 (or the roller 710) is brought into point contact with the edge surface of the substrate W in the embodiments above, the mode of contact between the press block 71 and the edge surface of the substrate W is not limited to this. In short, the cross section of the press block 71 may have other shape than a circular shape for point contact. Alternatively, the press block 71 and the edge surface of the substrate W may be brought into line contact instead of point contact.

Figure 19:
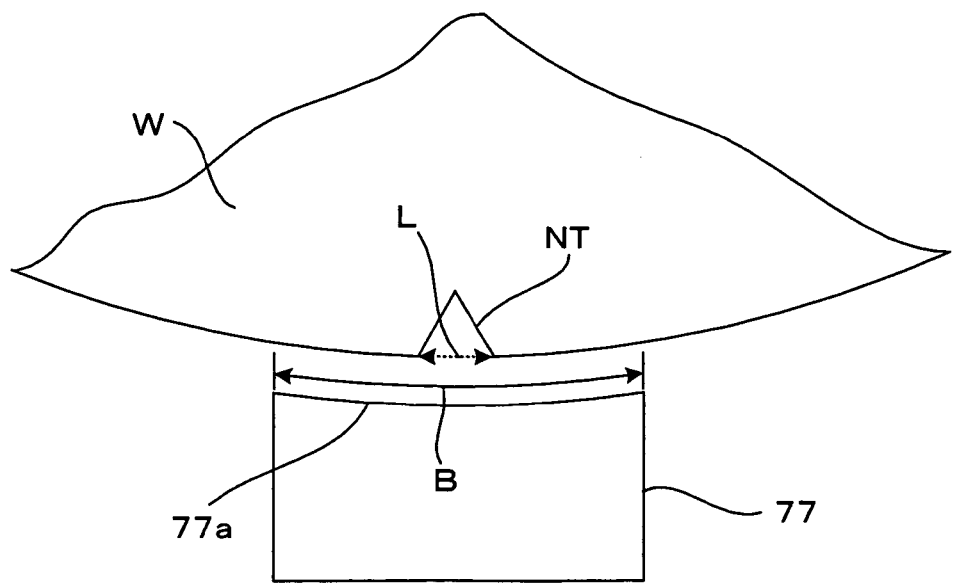
FIG. 19 is a drawing which shows modification of the press block.

For line contact of a press block with the edge surface of the substrate W, it is desirable that a press block 77 has a contact surface 77a whose width B exceeds the length L of an arc which is cut away from the circumference of the substrate W by the notch NT, as shown in FIG. 19. With this structure, it is possible to prevent the press block 77 from fitting in the notch NT and stably position the substrate W.

Further, although the press block 71 is driven and the abutting section 71a (the side surface of the press block 71) is positioned at the preset position P1 after the substrate has started rotating in the second embodiment above, this is not limiting. The press block 71 may be driven before the substrate starts rotating, to thereby position the abutting section 71a at the preset position P1.

Further, although the position of the substrate W is corrected while the press block 71 is kept continuously abutting on the rotating substrate W for a predetermined period of time in the second embodiment above, the position of the substrate W may be corrected while the press block 71 abuts on and moves away from the rotating substrate. With this structure, it is possible to reduce friction between the substrate W and the press block 71 (or the roller 710 or the press block 77) and prevent the substrate W from getting worn, damaged or otherwise degraded. In this case, it is desirable that the control unit 4 controls the cycle in which the press block 71 abuts on and moves away, such that the press block 71 abuts on the entire circumference of the substrate W.

Further, to completely eliminate the influence of the notch NT formed in the rim portion of the substrate W, a sensor for detecting the notch NT may be disposed in the second embodiment above. With this structure, it is possible to temporarily move the press block 71 (or the roller 710 or the press block 77) away from a position (preset position P1) at which the press block 71 can abut on the edge surface of the substrate W, upon detection of the notch NT by the sensor. This completely eliminates contact of the notch NT with the press block 71, and prevents the substrate W from getting displaced in an unintended direction.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which performs predetermined processing on a substrate while holding and rotating the substrate, comprising:

a substrate rotating mechanism having a predetermined center of rotation, the substrate rotating mechanism rotating said substrate about said predetermined center of rotation while supporting the substrate in such a manner that said substrate can freely slide in a horizontal direction, and holding said substrate by a force of friction developed at said substrate; and a position correcting mechanism which exerts in the horizontal direction a greater force than said force of friction upon said substrate held on said substrate rotating mechanism, makes said substrate slide toward the center of rotation of said substrate rotating mechanism, and accordingly corrects the position of said substrate in the horizontal direction, wherein said position correcting mechanism comprises:

a detector which detects an edge surface position of the edge surface of said substrate rotated by said substrate rotating mechanism which is a farthest from the center of rotation of said substrate rotating mechanism;

a single pressing member which has an abutting section abutting on the edge surface of said substrate and presses said substrate along the horizontal direction;

a driver which drives said pressing member to move said abutting section of said pressing member between a preset position which is away in the horizontal direction from the center of rotation of said substrate rotating mechanism by a distance which is equal to one of the radius of said substrate, and a distance which is the sum of a positive tolerance value for a target positioning accuracy and the radius of said substrate, and a separated position which is located farther than said preset position away from the center of rotation of said substrate rotating mechanism, said preset position, said separated position and the center of rotation being set in a same straight line in a horizontal plane; and a controller which stops said substrate rotating mechanism at a position where the farthest edge surface position detected by said detector is also in said straight line, and controls said driver to drive said pressing member to move said abutting section from said separated position to said preset position after stopping said substrate rotating mechanism, whereby said substrate is pushed by said pressing member, said abutting section abutting on the farthest edge surface position, toward the center of rotation of said substrate rotating mechanism until the farthest edge surface position detected by said detector matches with said preset position, wherein said substrate rotating mechanism comprises:

a rotating member configured to rotate freely;

a rotator unit which rotates said rotating member about said center of rotation;

plural first support pins which are disposed projecting upwardly from said rotating member, abut on the bottom surface of said substrate, hold said substrate at said rotating member utilizing the force of friction developing at the bottom surface of said substrate;

plural second support pins which are disposed projecting upwardly from said rotating member, abut on the bottom surface of said substrate, hold said substrate at said rotating member utilizing the force of friction developing at the bottom surface of said substrate, a coefficient of friction of the second support pins against the bottom surface of said substrate being larger than that of said first support pins, and a second controller which causes said first support pin group to abut alone on the bottom surface of said substrate when said position correcting mechanism is to correct the position of said substrate along the horizontal direction, and causes said second support pin group to at least abut on the bottom surface of said substrate when said predetermined processing is performed on said substrate.

2. The substrate processing apparatus of claim 1, wherein said substrate rotating mechanism further comprises a pressing unit which is distanced from said substrate creating a space therebetween, supplies gas onto the top surface of said substrate, presses said substrate against at least one of said first support pins and said second support pins, and holds said substrate at said rotating member.

3. The substrate processing apparatus of claim 1, wherein each one of said second support pins is capable of freely moving up and down, and said substrate rotating mechanism further comprises an elevating drive unit which moves the height of abutting parts of said second support pins which abut on the bottom surface of said substrate to a higher and a lower positions than an abutting position at which said first support pins abut on the bottom surface of said substrate.

4. The substrate processing apparatus of claim 3, wherein said second controller controls said elevating drive unit to move the height of abutting parts of said second support pins to a lower position than the abutting position of said first support pins when said position correcting mechanism is to correct the position of said substrate in the horizontal direction, and to a higher position than the abutting position of said first support pins when said predetermined processing is performed on said substrate.

5. The substrate processing apparatus of claim 1, wherein said pressing member comprises a roller which is capable of abutting on the edge surface of said substrate and freely rotating about an axis of revolution which extends along the direction of the axis of rotation of said substrate rotating mechanism.

6. The substrate processing apparatus of claim 5, wherein there is a nick section in a rim portion of said substrate, and the diameter of said roller is larger than the length of an arc which is cut away from the circumference of said substrate by said nick section.

7. The substrate processing apparatus of claim 1, wherein there is a nick section in a rim portion of said substrate, and said pressing member comprises a contact surface which comes into line contact with the edge surface of said substrate and whose width exceeds the length of an arc which is cut away from the circumference of said substrate by said nick section.

8. A substrate processing apparatus which performs predetermined processing on a substrate while holding and rotating the substrate, comprising:

a substrate rotating mechanism having a predetermined center of rotation the substrate rotating mechanism rotating said substrate about said predetermined center of rotation while supporting the substrate in such a manner that said substrate can freely slide in a horizontal direction, and holding said substrate by a force of friction developed at said substrate; and a position correcting mechanism which exerts in the horizontal direction a greater force than said force of friction upon said substrate held on said substrate rotating mechanism, makes said substrate slide toward the center of rotation of said substrate rotating mechanism, and accordingly corrects the position of said substrate in the horizontal direction, wherein said position correcting mechanism comprises:

a single pressing member which has an abutting section abutting on an edge surface of said substrate and presses said substrate in the horizontal direction;

a driver which drives said pressing member to move said abutting section of said pressing member between a preset position which is away in the horizontal direction from the center of rotation of said substrate rotating mechanism by a distance which is equal to one of the radius of said substrate, and a distance which is the sum of a positive tolerance value for a target positioning accuracy and the radius of said substrate, and a separated position which is located farther than said preset position away from the center of rotation of said substrate rotating mechanism, and a controller which controls said driver to drive said pressing member to position said abutting section to said preset position and controls said substrate rotating mechanism to rotate said substrate after said abutting section is positioned into said preset position, whereby said abutting section of said pressing member abuts on an edge surface position of the edge surface of said substrate thus rotated which is outward in the diameter direction from said preset position to push said substrate, and the position of said substrate is corrected toward the center of rotation of said substrate rotating mechanism, wherein said substrate rotating mechanism comprises:

a rotating member configured to rotate freely;

a rotator unit which rotates said rotating member about said center of rotation;

plural first support pins which are disposed projecting upwardly from said rotating member, abut on the bottom surface of said substrate, hold said substrate at said rotating member utilizing the force of friction developing at the bottom surface of said substrate;

plural second support pins which are disposed projecting upwardly from said rotating member, abut on the bottom surface of said substrate, hold said substrate at said rotating member utilizing the force of friction developing at the bottom surface of said substrate, a coefficient of friction of the second support pins against the bottom surface of said substrate is larger than that of said first support pins, and a second controller which causes said first support pins to abut alone on the bottom surface of said substrate when said position correcting mechanism is to correct the position of said substrate in the horizontal direction, and causes said second support pins to at least abut on the bottom surface of said substrate when said predetermined processing is performed on said substrate.

9. The substrate processing apparatus of claim 8, wherein said pressing member comprises a roller which is capable of abutting on the edge surface of said substrate and freely rotating about an axis of revolution which extends along the direction of the axis of rotation of said substrate rotating mechanism.

10. The substrate processing apparatus of claim 9, wherein there is a nick section in a rim portion of said substrate, and the diameter of said roller is larger than the length of an arc which is cut away from the circumference of said substrate by said nick section.

11. The substrate processing apparatus of claim 8, wherein said pressing member comprises;

a roller which is capable of abutting on the edge surface of said substrate and freely rotating about an axis of revolution which extends along the direction of the axis of rotation of said substrate rotating mechanism; and a rotation driver which rotates said roller, and said rotation driver rotates said roller in the opposite direction to the direction of rotation of said substrate and at the same circumferential speed as that of said substrate.

12. The substrate processing apparatus of claim 11, wherein there is a nick section in a rim portion of said substrate, and the diameter of said roller is larger than the length of an arc which is cut away from the circumference of said substrate by said nick section.

13. The substrate processing apparatus of claim 8, wherein there is a nick section in a rim portion of said substrate, and said pressing member comprises a contact surface which comes into line contact with the edge surface of said substrate and whose width exceeds the length of an arc which is cut away from the circumference of said substrate by said nick section.

14. The substrate processing apparatus of claim 8, wherein said substrate rotating mechanism further comprises a pressing unit which is distanced from said substrate forming a space therebetween, supplies gas onto the top surface of said substrate, presses said substrate against at least one of said first support pins and said second support pins, and holds said substrate at said rotating member.

15. The substrate processing apparatus of claim 8, wherein each one of said second support pins is configured to freely move up and down, and said substrate rotating mechanism further comprises an elevating drive unit which moves the height of abutting parts of said second support pins which abut on the bottom surface of said substrate to a higher position and a lower position than the abutting position at which said first support pins abut on the bottom surface of said substrate.

16. The substrate processing apparatus of claim 15, wherein said second controller controls said elevating drive unit to move the height of abutting parts of said second support pins to a lower position than the abutting position of said first support pins when said position correcting mechanism is to correct the position of said substrate in the horizontal direction, and to a higher position than the abutting position of said first support pins when said predetermined processing is performed on said substrate.

* * * * *